United States Patent [19]
Brown

[11] Patent Number: 5,732,004
[45] Date of Patent: Mar. 24, 1998

[54] DSP ARCHITECTURE FOR A FIR-TYPE FILTER AND METHOD

[75] Inventor: Glen W. Brown, Austin, Tex.

[73] Assignee: Advanced Micro Devices, Inc., Sunnyvale, Calif.

[21] Appl. No.: 555,685

[22] Filed: Nov. 14, 1995

[51] Int. Cl.⁶ ............................ G06F 17/10; G06F 17/17
[52] U.S. Cl. ........................... 364/724.16; 364/724.1
[58] Field of Search ............................ 364/724.16, 724.1

[56] References Cited

U.S. PATENT DOCUMENTS

| | | | |
|---|---|---|---|
| 4,590,457 | 5/1986 | Amir | 340/347 |
| 4,704,600 | 11/1987 | Uchimura et al. | 340/347 |
| 4,849,662 | 7/1989 | Holberg et al. | 397/520 |
| 4,851,841 | 7/1989 | Sooch | 341/143 |
| 4,876,542 | 10/1989 | van Bavel et al. | 341/143 |
| 4,918,454 | 4/1990 | Early et al. | 341/172 |
| 4,920,544 | 4/1990 | Endo et al. | 375/26 |
| 4,939,516 | 7/1990 | Early | 341/143 |
| 5,027,306 | 6/1991 | Dattorro et al. | 364/724 |
| 5,039,989 | 8/1991 | Welland et al. | 341/143 |
| 5,055,843 | 10/1991 | Ferguson, Jr. et al. | 341/143 |
| 5,061,928 | 10/1991 | Karema | 341/143 |
| 5,065,157 | 11/1991 | Ribner et al. | 341/143 |
| 5,068,660 | 11/1991 | Swanson et al. | 341/143 |
| 5,079,550 | 1/1992 | Sooch et al. | 341/143 |
| 5,084,702 | 1/1992 | Ribner | 341/143 |
| 5,103,229 | 4/1992 | Ribner | 341/143 |
| 5,148,166 | 9/1992 | Ribner | 341/143 |
| 5,148,167 | 9/1992 | Ribner | 341/143 |
| 5,153,593 | 10/1992 | Walden et al. | 341/143 |
| 5,157,395 | 10/1992 | Del Signore et al. | 341/143 |
| 5,162,799 | 11/1992 | Tanimoto | 341/143 |
| 5,182,723 | 1/1993 | Kamimura | 364/748 |
| 5,184,130 | 2/1993 | Mangelsdorf | 341/156 |
| 5,189,419 | 2/1993 | Lyden | 341/143 |
| 5,196,850 | 3/1993 | Duffy et al. | 341/76 |
| 5,198,817 | 3/1993 | Walden et al. | 341/143 |
| 5,208,597 | 5/1993 | Early et al. | 341/172 |
| 5,210,537 | 5/1993 | Mangelsdorf | 341/156 |
| 5,212,659 | 5/1993 | Scott et al. | 364/724.1 |
| 5,245,344 | 9/1993 | Sooch | 341/150 |
| 5,274,375 | 12/1993 | Thompson | 341/143 |
| 5,283,578 | 2/1994 | Ribner et al. | 341/143 |
| 5,298,900 | 3/1994 | Mauthe et al. | 341/143 |
| 5,311,181 | 5/1994 | Ferguson, Jr. et al. | 341/143 |
| 5,323,157 | 6/1994 | Ledzius et al. | 341/143 |
| 5,376,936 | 12/1994 | Kerth et al. | 341/150 |

FOREIGN PATENT DOCUMENTS

| | | | |
|---|---|---|---|
| 0328318A2 | 3/1989 | European Pat. Off. | H04B 14/04 |
| 045097A2/A3 | 4/1991 | European Pat. Off. | H03M 3/02 |

OTHER PUBLICATIONS

"A 16-Bit Oversampling A-to-D Conversion Technology Using Triple-Integration Noise Shaping," Matsuya, et al., *IEEE Journal of Solid State Circuits*, vol. SC-22, No. 6, pp. 921–929, Dec. 1987.

"A Third-Order Multistate Sigma-Delta Modulator with Reduced Sensitivity to Nonidealities," Ribner, et al., *IEEE Journal of Solid-State Circuits*, vol. 26, No. 12, pp. 1764–1774, Dec. 1991.

"A Self-Calibrating 15 Bit CMOS A/D Converter," Hae-Seung Lee et al.; *IEEE Journal of Solid State Circuits*, vol. SC-19, No. 6, Dec. 1984.

"A 12-Bit Successive-Approximation-Type ADC with Digital Error Correction," Kanit Bacrania, *IEEE Journal of Solid-State Circuits*, vol. SC-21, No. 6, Dec. 1986.

(List continued on next page.)

*Primary Examiner*—Tan V. Mai
*Attorney, Agent, or Firm*—Joseph W. King, Jr.

[57] ABSTRACT

The present invention is for an implementation of a digital decimation filter and/or digital interpolation filter and a method of decimating and/or interpolating a multi-bit input signal, where n/2 additions are performed, where n=the number of bits in each filter coefficient. Scaling and multiplication of data with coefficients is performed using a common DSP architecture. Coefficient values, having an associated scaling factor, are stored in memory. The coefficients are stored in coded form, and are then decoded prior to multiplication by the data values.

11 Claims, 10 Drawing Sheets

OTHER PUBLICATIONS

"A Third–Order Cascaded Sigma–Delta Modulators," Louis A. Williams III et al., *IEEE Transactions on Circuits and Systems*, 38 (1991) May, No. 5, New York, pp. 489–497.

"Low–Distortion Switched–Capacitor Filter Design Techniques," Kuang–Lu Lee, et al., *IEEE Journal of Solid–State Circuits*, vol. SC–20, No. 6, Dec. 1985, pp. 1103–1113.

"The Implementation of Digital Echo Cancellation in Codecs," Vladimir Friedman, et al., *IEEE Journal of Solid–State Circuits*, vol. 25, No. 4, Aug. 1990, pp. 979–986.

"A 192ks/s Sigma–Delta ADC with Integrated Decimation Filters Providing –97.4dB THD," Mark A. Alexander, et al., ISSCC94/Session 11/Oversampled Data Conversion/Paper TP 11.3, *1994 IEEE International Solid–State Circuits Conference*.

"A Voiceband Codec with Digital Filtering," James C. Candy, et al., *IEEE Transactions on Comunications*, vol. COM–29, No. 6, Jun. 1981, pp. 815–829.

"A Per–Channel A/D Converter Having 15–Segment µ–255 Companding," James C. Candy, et al, *IEEE Transactions on Communications*, vol. COM–24, Jan. 1976.

"Switched–Capacitor Second–Order Noise–Shaping Coder," G. Lainey, et al., *Electronics Letters*, 17th Feb. 1983, Vo. 19, No. 4, pp. 149–150.

"Multirate Filter Designs Using Comb Filters," Shuni Chu, et al., *IEEE Transactions on Circuits and Systems*, vol. CAS–31, No. 11, Nov. 1984, pp. 913–924.

"A 120dB Linear Switched–Capacitor Delta–Sigma Modulator," Donald A. Kerth, et al., *1994 IEEE International Solid–State Circuits Conference, Digest of Technical Papers*, TP 11.6, pp. 196–197, ISSCC94/Thursday, Feb. 17, 1994/Sea Cliff.

"A Stereo 97dB SNR Audio Sigma–Delta ADC," Tapani Ritoniemi, et al., *1994 IEEE International Solid–State Circuits Conference*, ISSCC94/Session 11/Oversampled Data Conversion/Paper TP 11.7, pp. 198–199.

"A Digitally–Corrected 20b Delta–Sigma Modulator," Charles D. Thompson, et al., *1994 IEEE International Solid–State Circuits Conference*, ISSCC94/Session 11/Oversampled Data Conversion/Paper TP 11.5, pp. 194–195.

"An Economical Class of Digital Filters for Decimation and Interpolation," Eugene B. Hogenauer., *IEEE Transactions on Acoustics, Speech, and Signal Processing*, vol. ASSP–29, No. 2, Apr. 1981, pp. 155–162.

"Decimation for Sigma Delta Modulation," James C. Candy, *IEEE Transactions on Communications*, vol. COM–34, No. 1, Jan. 1986, pp. 72–76.

"Multirate Digital Filters, Filter Banks, Polyphase Networks, and Applications: A Tutorial," P. P. Vaidyanathan, *Proceedings of the IEEE*, vol. 78, No. 1, Jan. 1990, pp. 56–93.

"A Multistage Delta–Sigma Modulator without Double Integration Loop," Toshio Hayaski, et al., *1986 IEEE International Solid–State Circuits Conference*, ISSCC 86/Thursday, Feb. 20, 1986/California Pavilion C, pp. 182–183.

"Circuit and Technology Considerations for MOS Delta–Sigma A/D Converters," Max W. Hauser et al., *1986 IEEE*, pp. 1310–1315.

"A 16b Oversampling A/D Conversion Technology using Triple Integration Noise Shaping," Yasuyuki Matsuya, et al., *1987 IEEE International Solid–State Circuits Conference*, ISSCC 87/Wednesday, Feb. 25, 1987/Trianon Ballroom, pp. 48–50.

"A 3–µm CMOS Digital Codec with Programmable Echo Cancellation and Gain Setting," Paul Defraeye, et al., *IEEE Journal of Solid–State Circuits*, vol. SC–20, No. 3, Jun. 1985, pp. 679–687.

"Fourth Order Sigma–Delta Modulator Circuit for Digital Audio and ISDN Applications," T. Karema, et al., Tampere University of Technology, Finland, pp. 223–227.

"Area–Efficient Multichannel Oversampled PCM Voice–Band Coder," Bosco H. Leung, et al., *IEEE Journal of Solid–State Circuits*, vol. 23, No. 6, Dec. 1988, pp. 1351–1357.

"Design and Implementation of Digital FIR Filters," P. P. Vaidyanathan, Chapter 2 in *Handbook of DSP Engineering Applications*, D. F. Elliot, editor, Academic Press, 1987.

"A 17–bit Oversampling D–to–A Conversion Technology Using Multistage Noise Shaping," Yasuyuki Matsuya, et al., *IEEE Journal of Solid–State Circuits*, vol. 24, No. 4, Aug. 1989, pp. 969–975.

"Reduction of Quantizing Noise by Use of Feedback*," H. A. Spang, III, and P. M. Schultheiss, reprinted from *IRE Trans. Commun. Systems*, pp. 373–380, Dec. 1962.

"A Higher Order Topology for Interpolative Modulators for Oversampling A/D Converters," Kirk C.–H. Chao, et al., reprinted from *IEEE Trans. Circuits and Sys.*, vol. CAS–37, pp. 309–318, Mar. 1990.

"A Stereo 16–Bit Delta–Sigma A/D Converter for Digital Audio*," D. R. Welland, et al., reprinted with permission from *Journal of the Audio Engineering Society*, vol. 37, pp. 476–486, Jun. 1989.

"A Monolithic 50 KHz 16–Bit A/D–D/A Converter Using Sigma–Delta Modulation," Charles D. Thompson, et al., Digital Signal Processor Operation/Motorola, Inc. 1990 *IEEE*.

"A CMOS Oversampling D/A Converter with a Current–Mode Semi–Digital Reconstruction Filter," D. Su and B. Wooley, *1993 ISSCC*, vol. 36, pp. 230–231.

"Design of Stable High Order 1–Bit Sigma–Delta Modulators," Tapani Ritoniemi, et al., Signal Processing Laboratory, Tampere University of Technology, reprinted from *IEEE Proc. ISCAS'90*, pp. 3267–3270, May 1990.

DECIMATOR 2 ARCHITECTURE - TRANSPOSED METHOD

BIT WIDTH = <NUMBER OF BITS, NUMBER OF INTEGER BITS>
ALL REGISTERS CLOCKED AT 2Fs

FIG. 4 DECIMATOR 3 ARCHITECTURE

DECIMATOR 3 ARCHITECTURE – TRANSPOSED METHOD

BIT WIDTH = <NUMBER of BITS, NUMBER of INTEGER BITS>
ALL REGISTERS CLOCKED at 2Fs

BIT WIDTH = <NUMBER of BITS, NUMBER of INTEGER BITS>

DSP ARCHITECTURE FOR A FIR-TYPE FILTER AND METHOD

BACKGROUND OF THE INVENTION

1. Field of the Invention

This invention relates to an implementation of a digital signal processor (DSP) architecture for use as a digital interpolation filter or a digital decimation filter.

2. Discussion of Related Technology

Commonly utilized DSP architecture for digital interpolation or digital decimation filters employ bit multiplication schemes that require hardware to perform a series of shifts and adds to multiply data by a particular filter coefficient. This typically requires the use of an adder for each group of bits to be multiplied where the number of adders is greater than one half the number of bits of the filter coefficient to be multiplied.

These commonly utilized filter also typically do not include a common data path for multiplication scaling of the numbers to be multiplied and accumulation of the products.

SUMMARY OF INVENTION

Described herein is a novel implementation of a DSP architecture which can be used to implement a digital interpolation filter, or a digital decimation filter, depending on the design requirement, and a method of performing such interpolation or decimation of a multi-bit input signal. The present invention codes a number, preferably a filter coefficient, performs scaling and multiplication functions upon the coded number and then decodes the product. This method results in a reduced requirement for adders, such that the number of required addition operations is equal to one half the number of bits representing the known number to be multiplied, typically bits of a filter coefficient, by another number, typically the input data.

The present invention utilizes a common data path for multiplication scaling of the numbers to be multiplied and accumulation of the products. This greatly reduces the amount of required hardware to perform the DSP filter multiplications.

DETAILED DESCRIPTION OF THE PREFERRED EMBODIMENT

Figure 1:
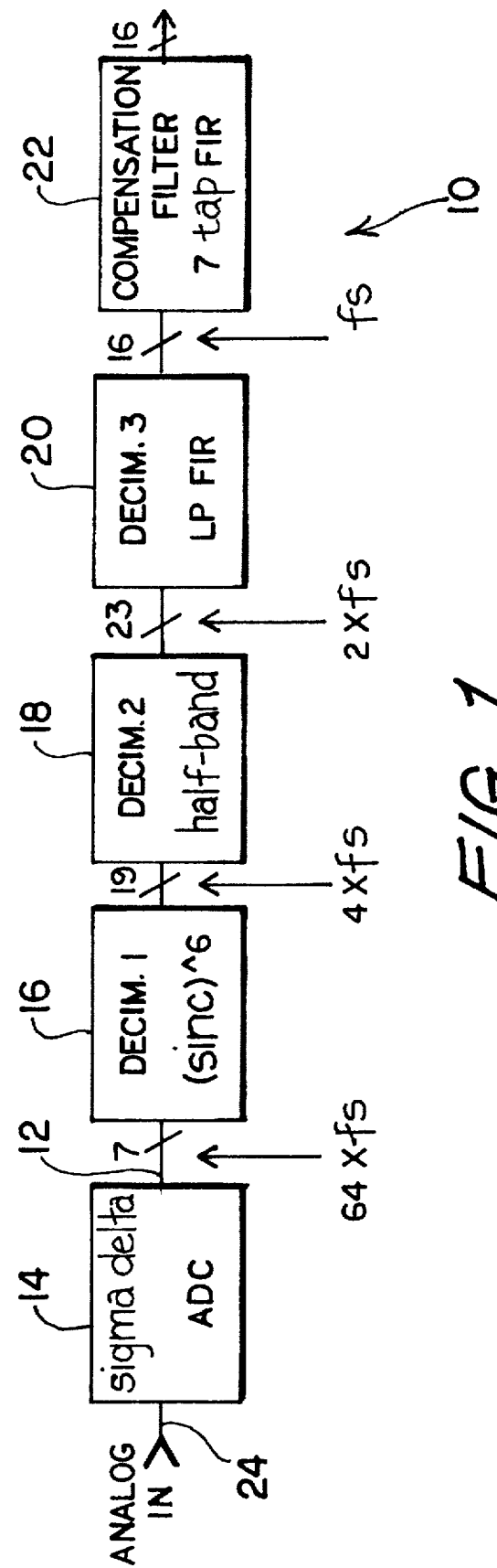
FIG. 1 is a block diagram of an A/D circuit which utilizes the DSP decimator architecture of the present invention.

The block diagram of an A/D circuit 10 utilizing the present invention is depicted in FIG. 1. Analog input data 24 is provided to delta-sigma ADC block 14, where the signal is converted to a 64 times over-sampled, or 64 Fs, digital input signal 12. This input signal 12 is input to the stages of the decimator (16, 18 and 20), where the signal is decimated by a factor of 16, from the sample frequency, 64 Fs, to 4 times the sample rate, 4 Fs, and is output to compensation filter 22 as a 16 bit signal. The 64 Fs input signal 12 is assumed to be band limited to Fs/2 by an anti-aliasing filter of adequate attenuation in the delta-sigma ADC block 14. The multi-stage decimation filter structure (16, 18 and 20) is more fully described in application Ser. No. 08/333,403, filed Nov. 2, 1994, entitled "A Digital Decimation and Compensation Filter System", assigned to the common assignee of the present invention and incorporated herein for all purposes. The fourth stage of the A/D circuit 10 is a compensation filter 22. Compensation filter 22 may be unnecessary in some A/D applications.

As described and shown in FIG. 1, the decimation of the 64 Fs input signal 12 is performed in three stages using decimators Decim. 1 (16), Decim. 2 (18) and Decim. 3 (20). Decim. 1 includes a 6th order sinc filter to decimate by 16. This filter produces some rolloff in the passband. In other applications, the Decim. 1 stage is unnecessary.

The next decimation stage, Decim. 2, reduces the sample rate by 2 to 2 Fs using a half-band filter with an attenuation of approximately 100 dB and a flat response in the passband. The third stage, Decim. 3, also uses a half-band filter having a cutoff starting at 0.45 Fs and a stopband attenuation of approximately 100 dB starting at 0.5 Fs. The final filter, a 7 tap linear phase FIR compensation filter 22, may be used to compensate for any passband rolloff in Decim. 1.

Figure 7:
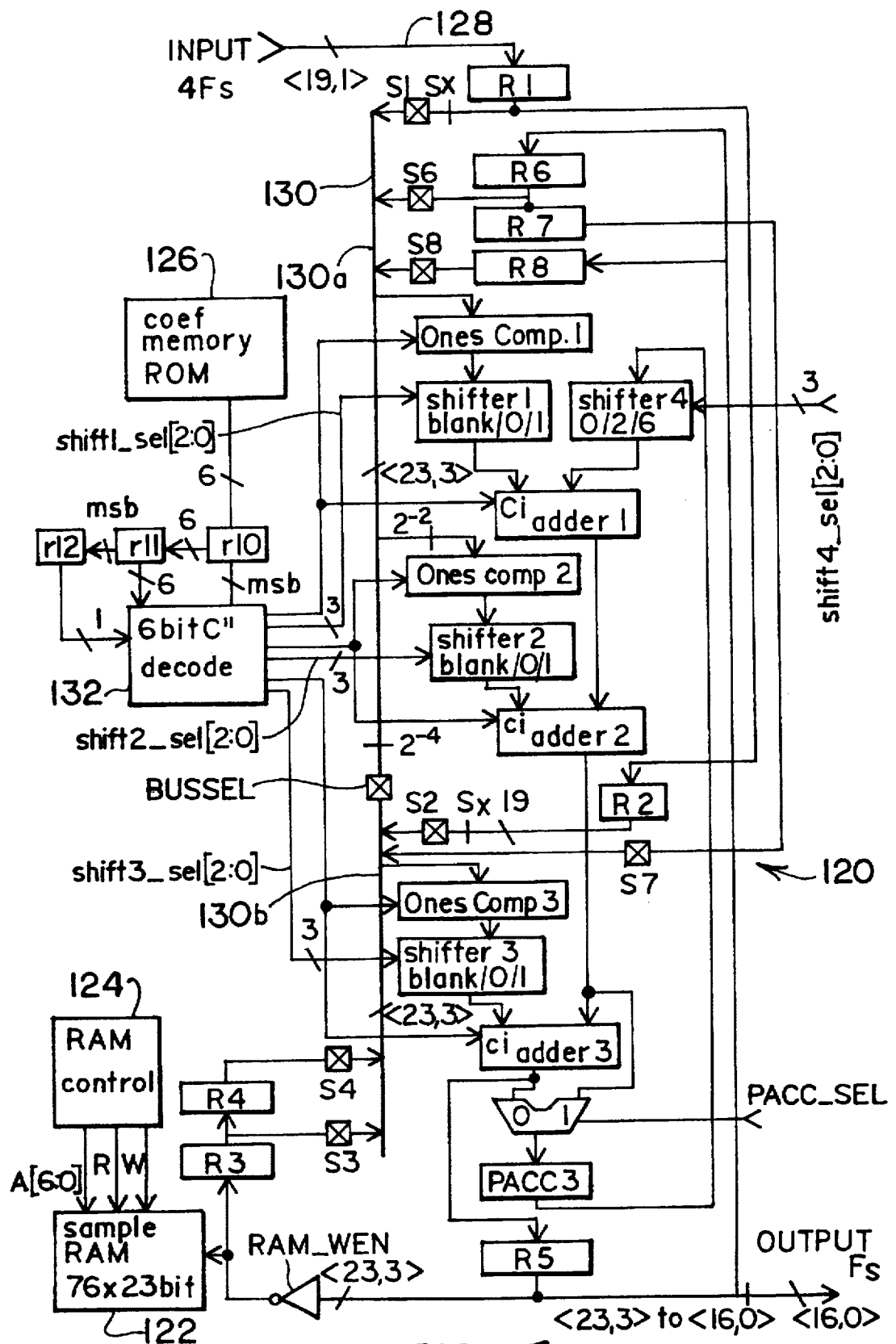
FIG. 7 is a block diagram of the preferred architecture for the DSP decimator architecture of the present invention.

The calculations implementing the Decim. 2 and Decim. 3 blocks are performed in the DSP architecture as shown in FIG. 7, and will be described below in further detail.

Decim. 2

Figure 2:
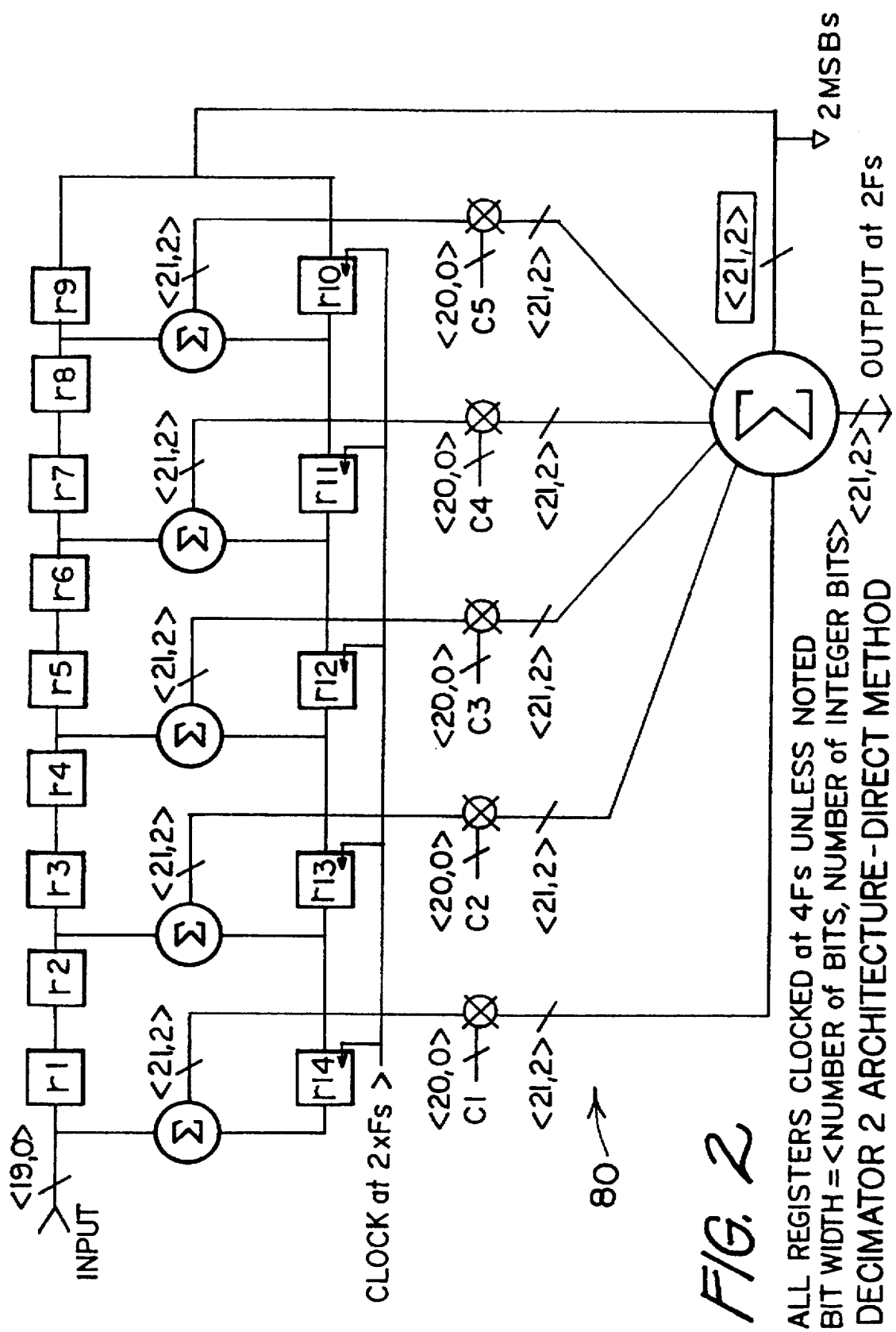
FIG. 2 is an embodiment of the functional block diagram of a decimator Decim. 2 stage.

Referring to FIG. 1, Decim. 2 is a liner phase half-band FIR filter. It has equal size stopband and passband and equal ripple in the passband and stopband. Decim. 2 may also be any linear phase FIR filter. A special property of half-band filters is that every other coefficient is zero. This can lead to advantages in the implementation. The Decim. 2 filter functional architecture 80, shown in FIG. 2, is implemented in a direct form. When the filter is in the form of a decimate by 2 and when the filter is transposed, an efficient regular structure results. This results in all processing of the filter calculation being performed at the lower rate of twice the sample frequency, i.e. 2 Fs, and all coefficients multiply the same data sample, the 19 bit input data, which has been output as 4 Fs output signal from Decim. 1 (FIG. 1), or from any other source having an output that is to be decimated by a factor of 2, or otherwise.

Figure 3:
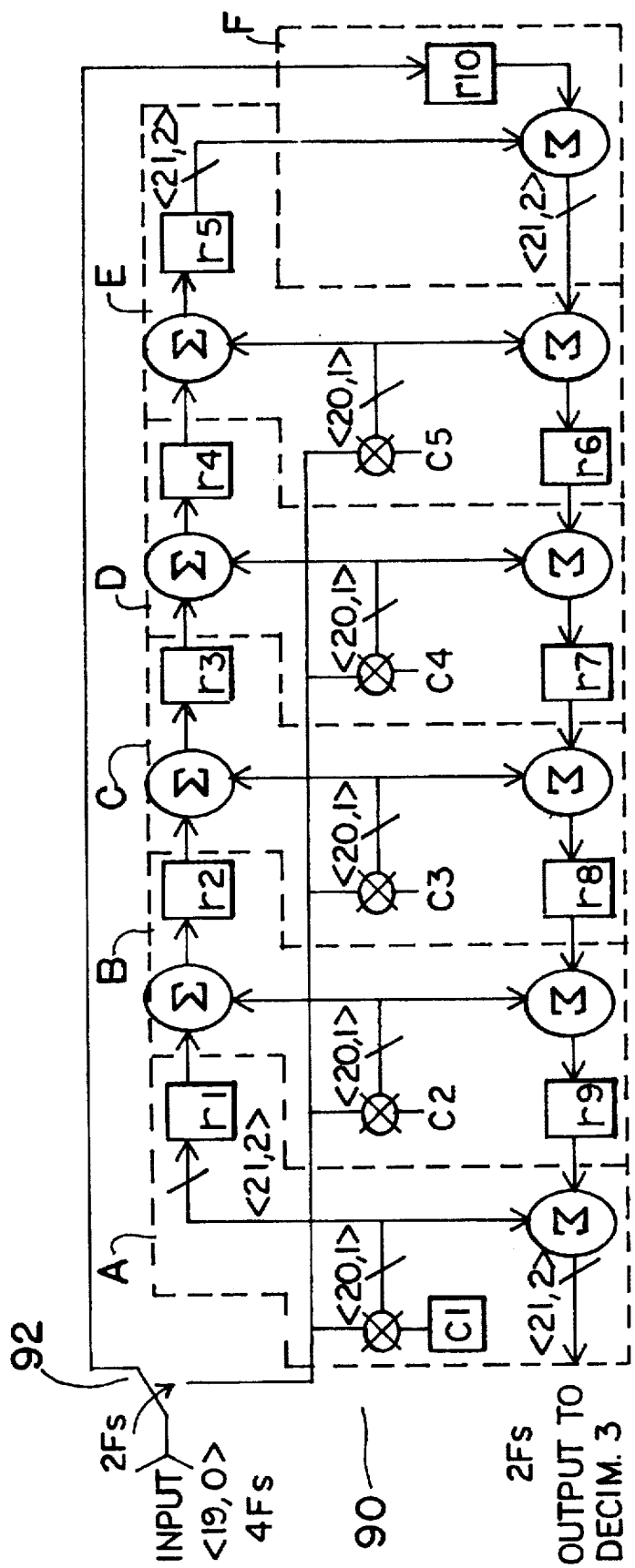
FIG. 3 is an additional embodiment of the functional block diagram of a decimator Decim. 2 stage.

The architecture 80 of Decim. 2 (FIG. 2) is preferably implemented in a transposed form as shown in the FIG. 3 functional block 90.

All registers, r1–r9, of block 90 are clocked at the rate of 2 Fs. The switch 92 on the input of block 90 toggles at the rate of 2 Fs, alternating input data into the registers for summation and to be multiplied by the coefficient data, c1–c5. This is accomplished because, as can be seen from FIG. 3, only the input data and data delayed by an even number of cycles are summed and multiplied by the coefficients, while the input data delayed by an odd number of clock cycles is summed with the products of the data times the coefficients.

Referring to FIG. 3, the odd delayed data is shown as shown as being stored for 11 clock cycles prior to being used. When the Decim. 2 filter is transposed, as in FIG. 3, the odd delayed data can be added in directly, without first being stored. The Decim. 2 filter coefficients are given in Table 1 below. The values are the non-zero coefficients used for multiplication by the data as shown in FIGS. 2 and 3. The center coefficient, C3, having a magnitude of 1.0, is not shown in Table 1, and is implemented by the data in r10 of FIG. 3.

Decim. 2 is implemented in FIG. 7 by performing the calculations as per equation (5). The operation of FIG. 7 will be described below in further detail.

The output of Decim. 2, as implemented by FIG. 3, is given by equation (5).

$$\text{Output}_n = (d_{n-10} + d_n)C1 + r10_{n-5} + \sum_{i=2}^{5}(d_{n-10+i} + d_{n+1-i})Ci \quad (1)$$

where:

d is the data at the input, available at 4 Fs;

the subscript "n" is a reference to clock cycle, where "n+1" is 1 clock cycle later;

C# is the coefficient as given in Table 1, where # is the coefficient number; and r10 is the data stored in register "r10" of FIG. 3.

In other embodiments, other filter coefficients for Decim. 2 may be used.

Decim. 2 Coefficients

TABLE 1

| coefficient number | coefficient value |
|---|---|
| 1 | 0.0016956329345703125 |
| 2 | -0.0121631622314453125 |
| 3 | 0.04854583740234375 |
| 4 | -0.1517887115478515625 |
| 5 | 0.6137218475341796875 |

Decim. 3

Figure 4:
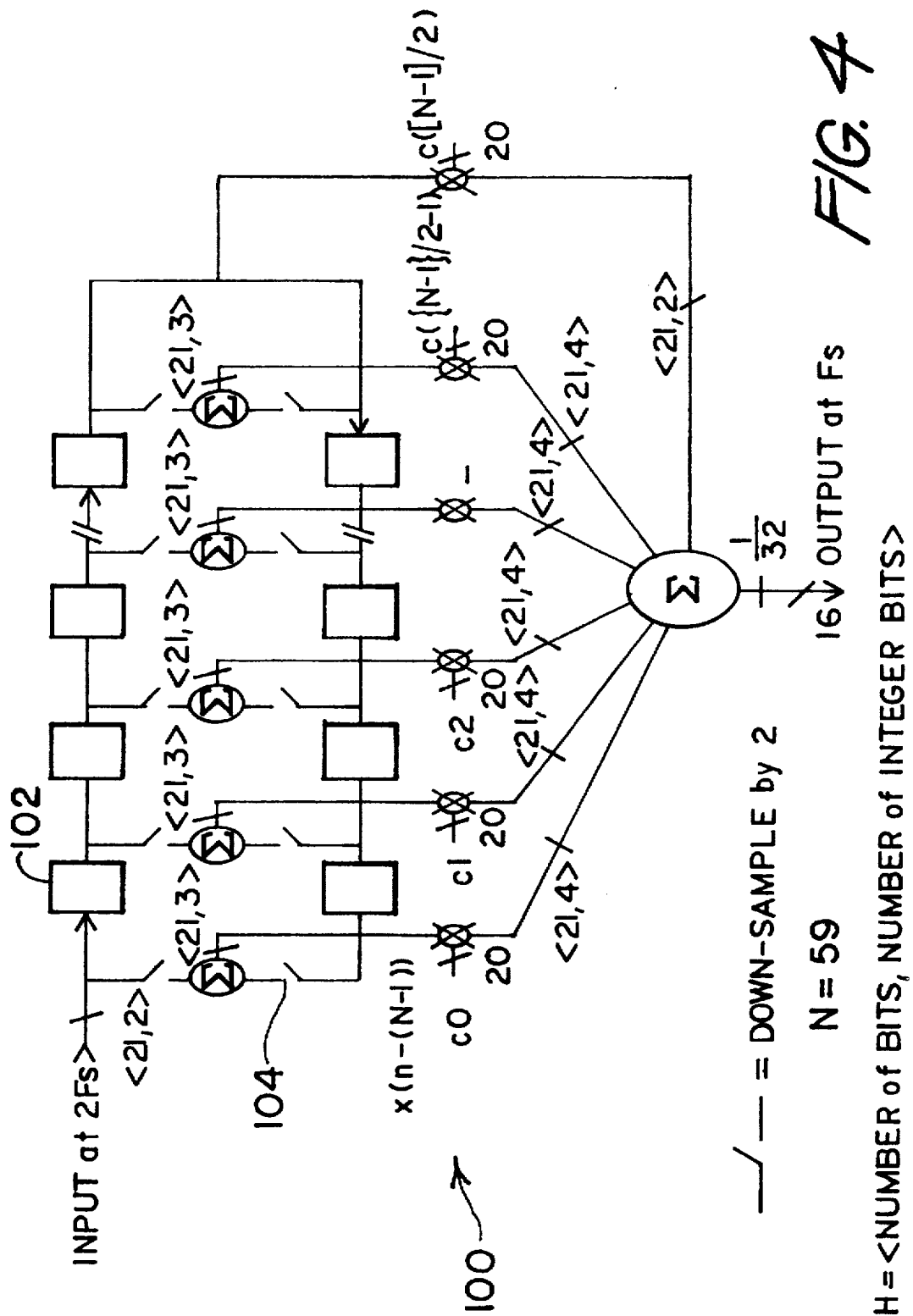
FIG. 4 is an embodiment of the functional block diagram of a decimator Decim. 3 stage.

Decim. 3, 20 (FIG. 1) is a linear phase FIR, having symmetrical coefficients. It is preferably a flat passband response half-band filter having 59 taps. It has approximately 100 dB of attenuation in the stopband and a less than ±0.1 dB in the passband. Its cutoff starts at 0.45 Fs and stops at 5 Fs. Other linear phase FIR filter implementations may otherwise be used for Decim. 3. The input data for Decim. 3 is output from the Decim. 2 stage (FIG. 1) at 2 Fs and is decimated in Decim. 3 by a factor of 2, to the sample rate, Fs. A special property of half-band filters is that every other coefficient is zero. When used as a decimate by two, Decim. 3 computes one output for every two data samples input. The functional block architecture 100 of the Decim. 3 filter, preferably implemented in a direct method, is shown in FIG. 4.

The coefficients are given by the subscripted "c" and the registers 102 are clocked at the input data rate of 2 Fs. The switches 104 shown in FIG. 4 close every other cycle, representing a calculation of an output value at the sample rate, Fs. The Decim. 3 stage is preferably implemented in a transposed method, the same as Decim. 2.

Figure 5:
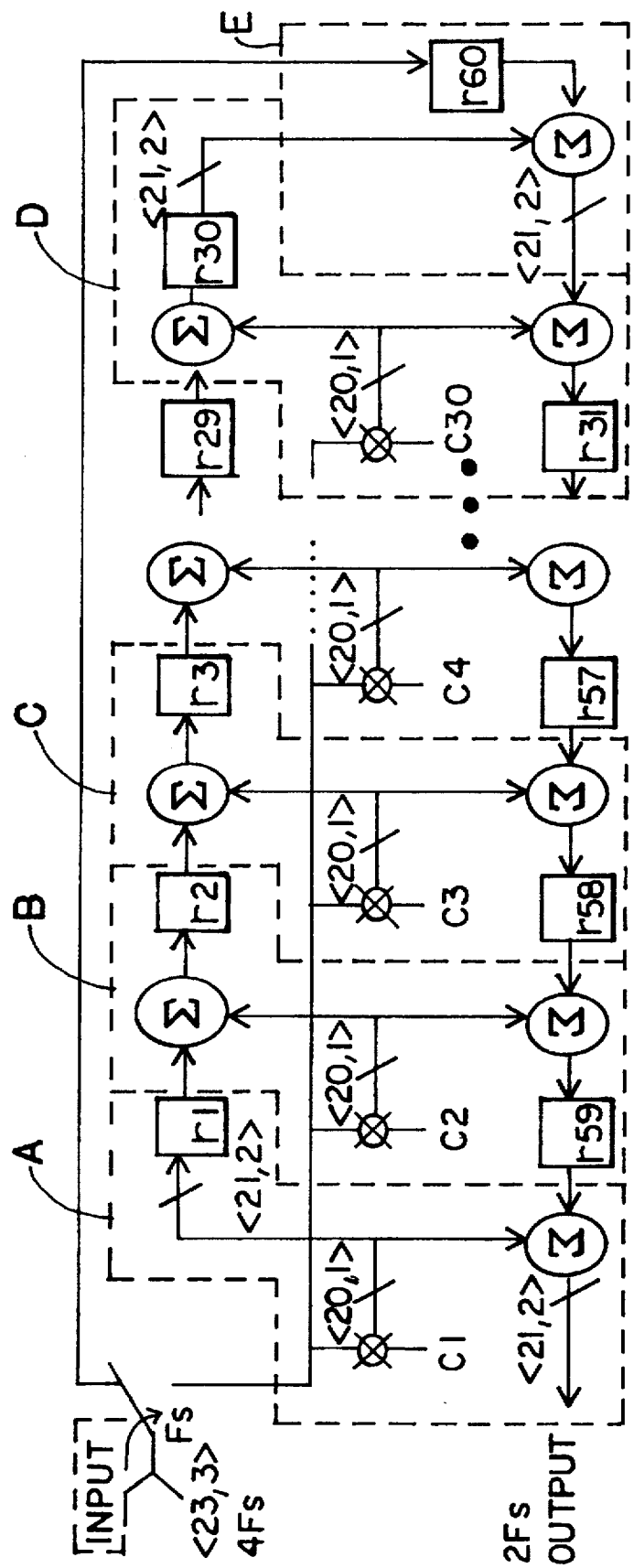
FIG. 5 is an additional embodiment of the functional block diagram of a decimator Decim. 3 stage.

The same structure results as in FIG. 3, with the extension to 30 coefficients instead of 5, as shown in FIG. 5. Since Decim. 2 and Decim. 3 both interpolate by a factor of 2, both have the same method of alternating input data between multiplication by the coefficients and summing into the data path. The coefficients for Decim. 3 are given in Table 2. The values are the non-zero coefficients used for multiplication by the data as shown in FIGS. 4 and 5. The center coefficient, having a magnitude of 1.0, is not shown in Table 2 and is implemented by the data in register r60 of FIG. 5

The output of Decim. 3, as implemented by FIG. 5, is given by equation (2).

$$\text{Output}_n = (d_{n-60} + d_n)C1 + r60_{n-30} + \sum_{i=2}^{30}(d_{n-60+i} + d_{n+1-i})Ci \quad (2)$$

where:

d is the data at the input, available at 2 Fs;

the subscript 'n' is a reference to clock cycle, where 'n+1' is 1 clock cycle later;

C# is the coefficient as given in Table 2, where # is the coefficient number; and r60 is the data stored in register "r10" of FIG. 5.

In other embodiments, other filter coefficients for Decim. 3 may be used.

Decim. 3 Coefficients

TABLE 2

| coefficient number | coefficient value |
|---|---|
| 1 | -0.0000286102294921875 |
| 2 | 0.000049591064453125 |
| 3 | -0.0000934600830078125 |
| 4 | 0.00016021728515625 |
| 5 | -0.0002574920654296875 |
| 6 | 0.0003948211669921875 |
| 7 | -0.0005855560302734375 |
| 8 | 0.0008392333984375 |
| 9 | -0.0011749267578125 |
| 10 | 0.00160980224609375 |
| 11 | -0.002162933349609375 |
| 12 | 0.0028553009033203125 |
| 13 | -0.0037174224853515625 |
| 14 | 0.0047740936279296875 |
| 15 | -0.006061553955078125 |
| 16 | 0.007617950439453125 |
| 17 | -0.009490966796875 |
| 18 | 0.011737823486328125 |
| 19 | -0.0144329071044921875 |
| 20 | 0.0176715850830078125 |
| 21 | -0.021591186523437 |
| 22 | 0.026386260986328125 |
| 23 | -0.0323505401611328125 |
| 24 | 0.039966583251953125 |
| 25 | -0.050060272216796875 |
| 26 | 0.0642070770263671875 |
| 27 | 0.08578109741210937 |
| 28 | 0.1235866546630859375 |
| 29 | -0.2099456787109375 |
| 30 | 0.6358623504638671875 |

Preferred Implementation of Decim. 2 and Decim. 3

Figure 6:
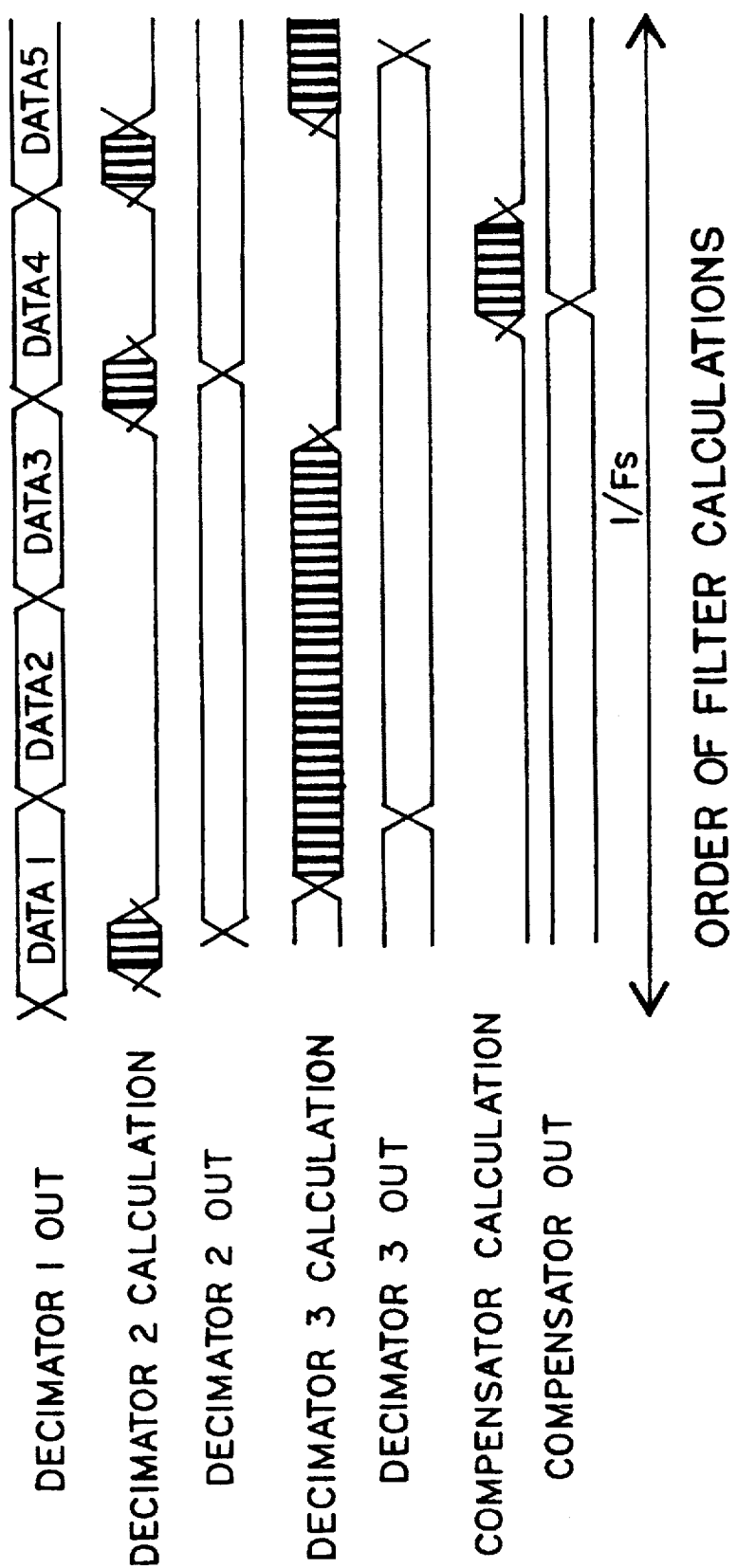
FIG. 6 is a partial timing diagram for calculations performed by the DSP decimator architecture of the present invention.

The two half-band FIR filters for these filter stages are implemented utilizing the timing diagram illustrated in FIG. 6. The order of the calculations for the filter outputs for each sample period is also shown in FIG. 6. For every sample period, 1/Fs, the output of Decim. 2 is calculated twice, at 2 Fs. The output of Decim. 3 is calculated at the sample rate, Fs. The compensation filter 22 is calculated at the sample rate, Fs. Each new Decim. 2 output can only be calculated after two new data inputs have been received.

Referring to FIG. 7, the data needed for the filter calculations of Decim. 2 and Decim. 3 are stored in one sample RAM 122. The 'RAM control' block 124 of FIG. 7 controls where the data is stored for each of the three filters. There are 10 storage locations used for Decim. 2, 90 and for Decim.

3. The coefficients for these filters are stored in the coefficient ROM 126. The coefficients are stored in the coefficient ROM 126 in the order they are needed to make the calculations for Decim. 2 and Decim. 3, respectively, for each sample period.

The coefficient multiplication of the input data is implemented in FIG. 7 using a summation of multiple shifts of the filter data for the particular filter being calculated. The technique used to implement the coefficient values is described here prior to the explanation of the architecture 120 implementing the Decim. 2 and Decim. 3 stages. The coefficients have varying levels of resolution to achieve the sharp transition region from passband to stopband of 0.1 Fs. The coefficient values of the filters in Tables 1 and 2, above, are given in terms of a 20 bit value with or without an exponential term. The coefficient's number, given in column 1 of Tables 1 and 2, is the position of the coefficient in the filter as given by the index in equations (1) and (2). The order of execution of the coefficient multiplication is by the coefficient number. The coefficients with the smallest magnitude are calculated first, followed by the coefficients with larger magnitudes. This method preserves the accuracy of the smaller coefficients with a constant word length. The 20 bit coefficient given in Tables 1 and 2 is stored in the coefficient memory ROM 126 of FIG. 7 in the order of execution.

The data path architecture 120 of FIG. 7 allows the same circuitry to perform the coefficient multiplication in an improved and efficient way for Decim. 2 and Decim. 3. This allows the coefficient values to be stored compactly in a single ROM 126.

In order to have an efficient calculation of the product terms, the coefficients are stored in the coefficient memory ROM 126 using a coded canonical format as given in equation (3). This reduces the weight, the number of non-zero bits, of the coefficients and therefore reduces the number of summations needed to form the product of the coefficient and data. The definition of these bits are given in equations (3) and (4).

Each 20 bit coefficient (C) of Tables 1 and 2 could be represented in canonical notation as:

$$C' = \Sigma b_j 2^{-j} \quad (3)$$

where $b_j \epsilon (-1, 0, 1)$ $j=0-19$ where $j=0$ is the MSB

This results in a minimally weighted number according to the well known canonical notation.

The 20 bit mantissa C', stored in memory are coded as follows. Let $C_j''$ represent each bit in the stored coefficient which is coded as follows:

$$C_j'' = 1 \text{ for } b_j = 1 \quad (4)$$

and let $$C_{j-1}'' = C_j'' = 1 \text{ for } b_j = -1 \text{ where } j=0-19 \quad (5)$$

since $b_j * b_{j-1} = 0$ for canonical representation. In other words, the zero to the left of a −1 bit is changed to a 1 and the −1 is changed to a 1.

The coefficients can not be stored directly in coefficient memory ROM 126 in canonical form since each canonical digit can take on one of three values. However, the coefficients can be stored in the coded $C_j''$ bit form, directly. For 20 bits of resolution in the coefficients, 21 bits need to be stored to allow the MSB to be coded when equal to −1. This results in easy decoding of the coefficient values without separating negative and positive canonical digits and storing them separately. The minimal weight of the representation allows a maximum number of additions of one half the number of bits used to represent the coefficient.

To calculate an output from the multi-stage decimation filter 18 and 20 (FIG. 1) where the sample rate ranges up to 48 KHz for audio systems using a crystal oscillator that is commonly 16.934 MHz or 24.576 MHz, a scheme is needed to perform the multiple accumulate operations along with the shifting operations needed to compensate for the scaled coefficients in one sample period. To use an architecture without a multiplier, typically a bit serial method is used to perform the multiplication task. This involves reading each bit of the coefficient from least significant bit (LSB) to most significant bit (MSB) and for each bit of the coefficient (multiplier) that is a '1', the data (multiplicand) is added in an accumulator. The value in the accumulator is typically shifted by one, equivalent to a multiplication by $2^{-1}$, prior to the next data value being added. However, this bit serial implementation does not have the throughput needed using the crystal frequencies mentioned above for audio rates.

The preferred method, implemented in FIG. 7, operates on 6 bits of the filter coefficient at a time, LSB to MSB. Since the coefficients are coded, as mentioned above, to operate on 6 bits, $C_j'' \Rightarrow C_{j-5}''$, the LSB of the next group, $C_{j-6}''$, is needed in order to decode the sign of the $C_{j-5}''^{th}$ bit. To decode the bit $C_j''$, of the stored coefficient, C'', the sign and magnitude of the MSB from the previous 6 bits is needed. Register r12 of FIG. 7 holds the coded bit, $C_{j+1}''$, 1 LSB over from the current 6 bits being decoded. The decoded sign of the bit in r11 is stored in 'C'' 6 bit decode block'. These 9 bits are made available to decode the $C_j'' \Rightarrow C_{j-5}''$ bits by always reading ahead 6 bits. The coefficient bits are read out of the 'coef memory ROM' 126, 6 bits at a time, into r10, where j=14, 8, 2.

Below are the logic equations used to calculate the amount of shift needed as a result of decoding the current six bits of the filter coefficient. The amount of shift determined from the decoding of the current 6 coefficient bits is used to control 'shifter 1', 'shifter 2', and 'shifter 3' of FIG. 7, with control inputs 'shift1_sel[2:0]', 'shift2_sel[2:0]', and 'shift3_sel[2:0]' of FIG. 7. The 6 coefficient bits can result in seven possibilities for 'shifter_1', 'shifter_2' and 'shifter_3' of FIG. 7, namely, 6 values to shift the data, or to output a value of zero. If one of the shifters is not needed for a particular calculation, it outputs all zeros. All three shifters may output zero if all the coefficient bits being decoded are zero.

The new value of the sign of $C_{j+1}''$:

$$\begin{aligned}
r12\_sign = &\ r10[0]\ \&\ r10[5]\ \&\ ^-r10[4]\ \| \\
& r10[0]\ \&\ r11[5]\ \&\ r11[4]\ \&\ r11[3]\ \&\ ^-r11[2]\ \&\ \| \\
& r10[0]\ \&\ r11[5]\ \&\ r11[4]\ \&\ r11[3]\ \&\ r11[2]\ \&\ r11[1]\ \&\ ^-r11[0] \\
& \&\ \| \\
& r10[0]\ \&\ r11[5]\ \&\ r11[4]\ \&\ r11[3]\ \&\ r11[2]\ \&\ r11[1]\ \&\ r11[0] \\
& \&\ \\
& r12\_sign)
\end{aligned} \quad (6)$$

$$\begin{aligned}
shift\_0 = &\ (r11[5]\ \&\ ^-r11[4]\ \| \\
& r11[5]\ \&\ r11[4]\ \&\ r11[3]\ \&\ ^-r11[2])\ \| \\
& r11[5]\ \&\ r11[4]\ \&\ r11[3]\ \&\ r11[2]\ \&\ r11[1]\ \&\ ^-r11[0]\ \| \\
& r11[5]\ \&\ r11[3]\ \&\ r11[2]\ \&\ r11[1]\ \&\ \&\ r11[0]\ \&\ r12 \\
& \&\ r12\_sign)
\end{aligned} \quad (7)$$

$$\begin{aligned}
shift\_1 = &\ (r11[4]\ \&\ ^-r11[3]\ \| \\
& r11[4]\ \&\ r11[3]\ \&\ r11[2]\ \&\ ^-r11[1])\ \| \\
& r11[4]\ \&\ r11[3]\ \&\ r11[2]\ \&\ r11[1]\ \&\ r11[0]\ \&\ ^-r12\| \\
& r11[4]\ \&\ r11[3]\ \&\ r11[2]\ \&\ r11[1]\ \&\ \&\ r11[0]\ \&\ r12 \\
& \&\ ^-r12\_sign)
\end{aligned} \quad (8)$$

-continued $$\text{shift\_2} = (r11[3] \ \& \ \bar{}r11[2] \ ||$$
$$r11[3] \ \& \ r11[2] \ \& \ r11[1] \ \& \ \bar{}r11[0]) \ ||$$
$$r11[3] \ \& \ r11[2] \ \& \ r11[1] \ \& \ r11[0] \ \& \ r12 \ \& \ r12\_\text{sign}) \tag{9}$$

$$\text{shift\_3} = (r11[2] \ \& \ \bar{}r11[1] \ ||$$
$$r11[2] \ \& \ r11[1] \ \& \ r11[0] \ \& \ \bar{}r12) \tag{10}$$

$$\text{shift\_4} = (r11[1] \ \& \ \bar{}r11[0] \ ||$$
$$r11[1] \ \& \ r11[0] \ \& \ r12 \ \& \ r12\_\text{sign}) \tag{11}$$

$$\text{shift\_5} = (r11[0] \ \& \ \bar{}r12\_\text{sign}) \ || \ r11[0] \ \& \ \bar{}r12) \tag{12}$$

$$TC1 = (r10[0] \ \& \ r11[5] \ || \ r11[5] \ \& \ r11[4] \ \& \ \text{shift\_1}) \tag{13}$$

$$TC2 = (r11[4] \ \& \ r11[3] \ || \ r11[3] \ \& \ r11[2] \ \& \ \text{shift\_3}) \tag{14}$$

$$TC3 = (r11[2] \ \& \ r11[1] \ || \ r11[1] \ \& \ r11[0] \ \& \ \text{shift\_5}) \tag{15}$$

where:

shift_x causes a bit shift equivalent to $2^{-x}$ in shifter 1 and shifter 2;

the symbol "¯" is the a logical inversion;

the symbol '||' is the logical OR function; and the symbol '& ' is the logical AND function.

Figure 10:
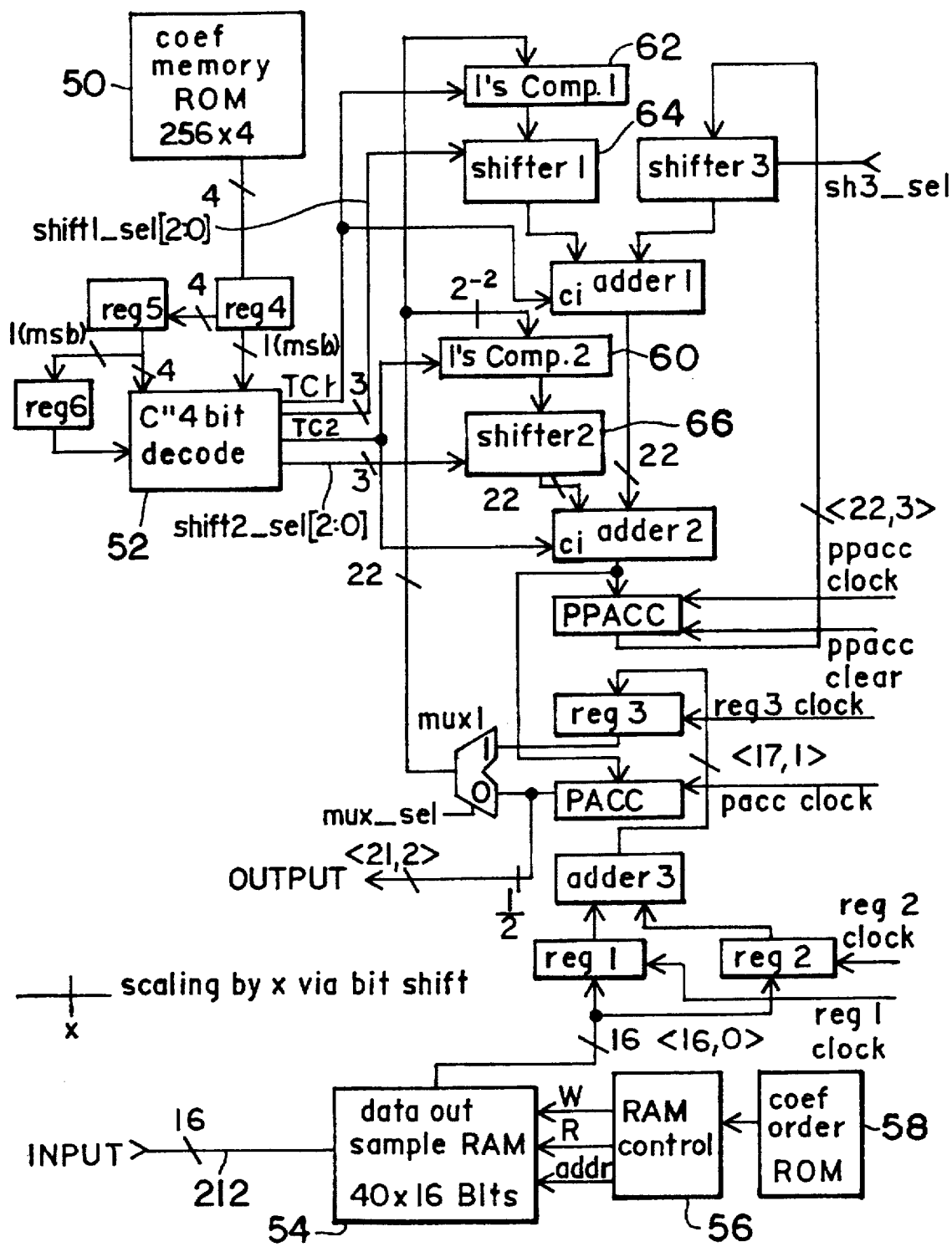
FIG. 10 is the DSP architecture which implements the interpolation filter of the present invention.

The following describes the calculation of the output of Decim. 2 and Decim. 3 (FIG. 1) in reference to the DSP architecture 120 of FIG. 7. The output of Decim. 2 is calculated using data inputs to be decimated. The timing diagram of FIG. 6 shows that for every sample period, 1/Fs, two Decim. 2 outputs are calculated. The output of Decim. 3 is calculated using two Decim. 2 outputs. FIG. 10 shows that for every sample period, 1/Fs, two Decim. 2 outputs are available, at a rate of 2 Fs, and one Decim. 3 output is calculated at the sample rate, Fs. The calculation of Decim. 2, using the signal processing architecture 120 of FIG. 7, will be described.

The architecture of the Decim. 2 filter has been separated, as shown in FIG. 3, into similar but separate processing blocks, A–F, indicated with dotted lines. The Decim. 2 filter calculations within blocks A and F are unique, while the calculations within blocks B–E are the same. The calculations performed using the architecture 120 of FIG. 7 will be described in terms of these FIG. 3 processing blocks.

The description of the operation of the architecture 120 of FIG. 7 will state when the switches 's1–4, s6–8' of FIG. 7 are closed, connecting the output of the registers to the common bus 130. The control signal 'bussel'=1 of FIG. 7 connects the two halves of the bus 130a and 130b. Unless a switch is describes as closed, it should be assumed to be open, which isolates the output of the register connected to each respective switch. The switches can be implemented by various means of driving the bus 130 with a device having a tristate output function. The preferred embodiment uses N-channel and P-channel CMOS devices as a commonly used transmission gate.

To calculate an output of Decim. 2, block A of FIG. 3 must be calculated. The first clock cycle used to calculate block A is as follows. The first data input to Decim. 2 is stored in register 'r1' of FIG. 7. The 6 LSBs of the first Decim. 2 filter coefficient, $C1_{14-19}$, of the coded coefficients, are read out of the 'coef memory ROM' 126 and stored in register 'r10' of FIG. 7.

The next clock cycle will be referred to as cycle 1 of block A. On this clock cycle, the value in register 'r1' is stored in register 'r2', and a new data input is stored in register 'r1'. The second data input in register 'r1' is the input data to be multiplied by the Decim. 2 filter coefficients, as shown in FIG. 3. The first data input in register 'r2' is the data value stored in register 'r10' of FIG. 3. The output of register 'r10' of FIG. 7 is stored in register 'r11' of FIG. 7, and the next 6 Decim. 2 filter coefficients bits from the first coefficient, $C1_{8-13}$, of the coded coefficients, are read out of 'coef memory ROM' 126 and stored in register 'r10' of FIG. 7. The MSB in register 11 is transferred into register 12, which would initially be 0 from reset. Internal to the 'C" 6 bit Decode' block 132 of FIG. 7, the sign of this bit is stored from the previous decode as r12_sign. Initially, this value would also be 0 from reset.

The '6 bit C" decode' block 132 decodes the 6 filter coefficient bits output from register 'r11' according to equations (6)–(12). Equations (6)–(12) are used to control the three shifters, 'shifter 1', 'shifter 2', and 'shifter 3' of FIG. 7. The control signals 'shift1_sel[2:0]', 'shift1_sel[2:0]', and 'shift1_sel[2:0]' of FIG. 7 are used to control the shifters. When the coefficients that were coded according to equations (4) and (5) are decoded, each results in a signed digit. The signals TC1, TC2, and TC3 of FIG. 7 are used to control the 'one's compliment 1', 'one's compliment 2', and 'one's compliment 3' blocks, according to equations (13)–(15). The two's complement is also formed by using these TC(x) signals to control the carry in, 'ci' of 'adder 1', 'adder 2' and 'adder 3', respectively, of FIG. 7. Thus, a total of nine bits of information are used to decode the 6 Decim. 2 filter coefficient C" bits to be multiplied by the data sum to form a partial product, as shown in equation (16).

$$PP_j=(C''_{j+5}) * (\text{data}) \tag{16}$$

where j=bit positions (19, 13, 7, 1) and j=0 is the MSB, j=19 is the LSB

The product of the 20 bit coefficient times the data sum is calculated as shown using equation (17).

$$P=(((((PP_{19} \times 2^{-6})+PP_{13}) \times 2^{-6})+PP_7) \times 2^{-6})+PP_3 \times 2^{-2}) \tag{17}$$

In summary, the 6 bits in r11, i.e. $C''_j = > C''_{j-5}$, the MSB bit in r12, i.e. $C''_{j+1}$, the sign of $C''_{j+1}$ which is stored in the 'C" 6 bit decode' block 132 of FIG. 7, and the MSB bit in r10 which represents the $C''_{j-6}$ bit, are all made available to the 'C" 6 bit decode' block 132 of FIG. 7. The shifts of $2^0$ and $2^{-1}$ are implemented in shifter1 of FIG. 7. The shifts of $2^{-2}$ and $2^{-3}$ are implemented in shifter2 of FIG. 7. The shifts of $2^{-4}$ and $2^{-5}$ are implemented in shifter3 of FIG. 7.

During the calculation of the particular products, the switch 's1' and 'bussel' of FIG. 7 are closed, connecting the output register 'r1' to the inputs of the 'one's comp. 1' block. The closed switch also connects the output of register 1, to the input of the 'ones comp 2' block after bit shifting to the right 1 bits, and to the input of the 'ones comp 3' block after bit shifting to the right 2 bits. During the formation of the first partial product of equation (16), when j=–19, the input signal 'pacc_sel'=0 and register 'PACC' is cleared. The shifted data that forms the partial product is added with 'adder 1', 'adder 2' and 'adder 3' of FIG. 7. During this cycle, the 'RAM control' block 124 reads the data value of register 'r9' of FIG. 3.

The next clock cycle will be referred to as cycle 2 of block A. In this clock cycle, the output of 'adder 3' is stored in register 'PACC' through the 'pacc_mux', with 'pacc_sel'=0. The MSB of register 'r11' is stored in register 'r12' of FIG. 7. The sign of 'r12' is stored in the '6 bit C" decode' block 132 as 'r12_sign'. The coefficient bits in register 'r10', $C1_{18-13}$, is stored in register 'r11' and the next 6 bits of the coded coefficient, $C1_{2-7}$, are stored in register 'r10'. The 'C" 6 bit decode' block 132 decodes the 6 bits in register 'r11' and controls the three shifters and 'one's complement' blocks according to the decoded data using equations (5)–(14). The 'shift4_sel[2:0]' input signal causes the 'shifter 4' block to shift the output of register 'PACC' to the right by 6 bits to align the partial product at the output of 'pacc', $PP_{19}$, to the next partial product being formed, $PP_{13}$. During this cycle, the output of the 'sample RAM' 122 of FIG. 7, is stored in register 'r3', which is equivalent to register 'r9' of FIG. 3.

The next clock cycle will be referred to as cycle 3 of block A. In this clock cycle, the output of 'adder 3', the sum of two partial products $PP_{19}+PP_{13}$, is stored in register 'PACC' through the 'pacc_mux', with control signal 'pacc_sel'=0. The MSB of register 'r11' is stored in register 'r12' of FIG. 7. The sign of 'r12' is stored in the '6 bit C" decode' block 132 as 'r12_sign'. The coefficient bits in register 'r10', $C1_{2-7}$, are stored in register 'r11', and the next 2 bits of the coded coefficient, $C1_{1-0}$, are stored in 'r10'. The 2 coefficient bits are loaded in the MSB position of register 'r10', r10[5:4], while the LSBs are loaded with the pattern, r10[3:0]=0010. The pattern in the 4 LSBs of 'r10' is used by the data path architecture 120 of FIG. 7 to form an addition in the same cycle as completing the accumulation of partial products of equation (17). This will described below in further detail. The 'C" 6 bit decode' block 132 decodes the 6 coefficient bits in register 'r11', $C1_{2-7}$, and controls the three shifters and 'one's complement' blocks according to the decoded coefficients. The 'shift4_sel[2:0]' control input causes the 'shifter 4' block to shift the output of register 'PACC' to the right by 6 bits to align the accumulated partial product in 'pacc', $PP_{19}+PP_{13}$, with the next partial product being formed, $PP_7$. During this cycle, the output of 'r3' of FIG. 7, which is 'r9' of FIG. 3, is stored in register 'r4' of FIG. 7.

The next clock cycle will be referred to as cycle 4 of block A. In this clock cycle, the output of 'adder 3' is stored in register 'PACC' through the 'pacc_mux', with control signal 'pacc_sel'=0. The MSB of 'r11' is stored in 'r12' of FIG. 7. The sign of 'r12' is stored in the '6 bit C" decode' block 132 as 'r12_sign'. The coefficients bits in 'r10', $C1_{1-0}$, is stored in 'r11' along with the 4 coefficient bits stored in the LSBs of 'r10'. Since only 2 coefficient bits are decoded, they result is potential shifts of $2^{-0}$ or $2^{-1}$ which are implemented in 'shifter 1'. The bits stored in the unused LSBs of 'r10' cause the 'shifter 2' block and 'shifter 3' block to output zero.

The next clock cycle will be referred to as cycle 5 of block A. In this clock cycle, the output of 'adder 2' is stored in register 'PACC' through the 'pacc_mux' with 'pacc_sel'= 1. Register 'r12' and the stored 'r12_sign' bits are cleared. Register 'r11' is cleared, with the value '000010'. The decode of 'r11' by the 'C" 6 bit decode' block 132 results in 'shifter 1' and 'shifter 2' outputing zero. The 6 bits of the next coded coefficient, $C2_{13-19}$, are stored in 'r10'. The 'bussel' control input, which has been closed, is opened. The control switch 's4' is closed, which connects the output of 'r4' with the input of the 'ones comp 3' block. The control signal 'shift4_sel[2:0]' causes 'shifter 4' to shift the output of register 'pacc' by 2 bits. The output is shifted by 2 bits instead of 6, as in previous cycles, because the last partial product was obtained with the last 2 coefficient bits, $C_{0-1}$ being read. The output of 'adder 2' contains the product of the data in 'r1' and the coefficient C1, P1, as given by equation (17). The output of 'adder 3' of FIG. 7 is the product, P1, plus the data in register 'r9' of FIG. 3. This is the new output of Decim. 2. This concludes the calculations performed for block A of FIG. 3, although the storing of the data on the output of the value in 'adder 2' and 'adder 3' occurs on subsequent cycles.

The next clock cycle will be referred to as cycle 1 of block B. This cycle stores the output of 'adder 3', the Decim. 2 output, in register 'r5' of FIG. 7, to be stored in 'r6' on the next cycle for input to be utilized in Decim. 3 calculations. This cycle begins the processing of block B, as shown in FIG. 3. Registers 'r10', 'r11, and 'r12' of FIG. 7 are clocked, advancing the data in the registers similar as described previously for each of the cycles of processing block A, above. Register 'r10'of FIG. 7 stores the next coded filter coefficient, $C2_{8-12}$, read out from the 'coef memory ROM' 126. Register 'r11' stores the value in 'r10', $C2_{13-19}$. The '6 bit C" decode' block 132 decodes the coefficient bits $C2_{13-19}$. The control signal 'bussel'=1, which connects the output of 'r1' to the 'ones comp 3' block. The switch state of 's4'=0 isolates the output of 'r4'. Register 'pacc' is cleared, and the control signal 'shift4_sel[2:0]' causes 'shifter 4' to shift the output of 'pacc' by 6 bits. Although this not used in this first cycle of calculating P2, because the contents of 'pacc' have been cleared, it is used in the subsequent 3 cycles. The output of 'adder 3' contains the first partial product, $PP_{19}$, of C2 times the data, $PP2_{19}$.

The next 3 clock cycles, cycles 2–4 of block B, proceed in a manner similar to cycles 2–4 of block A. During cycle 2, the data stored in 'r5' is stored in 'r6'. In cycles 3 and 4, the data read out of the 'sample RAM' 122 and stored in 'r4' of FIG. 7 is data representing register 'r8' of FIG. 3. The data stored in 'r3' of FIG. 7 is data representing register 'r1' of FIG. 3.

The next clock cycle is cycle 5 of block B. In this clock cycle, the output of 'adder 2' is stored in register 'pacc' through the 'pacc_mux' by control signal 'pacc_sel'=1. Register 'r11' is cleared with the value '000010'. The decode of 'r11' by the 'C" 6 bit decode' block 132 results in 'shifter 1' and 'shifter 2' outputing zero. The 'bussel' control input, which has been closed, is opened. The control switch 's4' is closed, connecting the output of 'r4' of FIG. 7, which is the value in 'r8' of FIG. 3, to the input of the 'ones comp 3' block of FIG. 7. The control signal 'shift4_sel[2:0]' causes 'shifter 4' to shift the output of register 'pacc' by 2 bits. The output is shifted by 2 bits instead of 6 bits, as in previous cycles, because the last partial product was obtained with the last 2 coefficient bits, $C_{0-1}$. The output of 'adder 2' contains the product of the data in 'r1' of FIG. 7 and the filter coefficient C1, P1, as given by equation (17). The output of 'adder 3' is the product, P1, plus the data in register 'r8' of FIG. 3. This is the new output of 'r9' of FIG. 3.

The next clock cycle will be referred to as cycle 6 of block B. This cycle stores the output of 'adder 3', the new 'r9' of FIG. 3, in register 'r5' of FIG. 7. On the next cycle, cycle 1 of block C, the filter tap value in register 'r5' of FIG. 7 will be stored in the 'sample RAM' 122. The switch 's4' is opened, to isolate 'r4', and switch 's3' is closed. The control input 'shifter4_sel[2:0] causes 'shifter 4' to pass the output of 'pacc' with no shift. Since 'r3' contains the value of register 'r1' in FIG. 3, the output of 'adder 3' of FIG. 7 is the new value of register 'r2' of FIG. 3.

During the next clock cycle, cycle 1 of block C, the output of 'adder 3' will be stored in register 'r5' of FIG. 7. On cycle 2 of block C, the new value of register 'r2' of FIG. 3 will be stored in the 'sample RAM' 122 of FIG. 7.

The processing of blocks C and D of FIG. 3 proceed in a similar manner as block B. Each processing block reads the necessary data from the 'sample RAM' 122. For block C, the data representing registers 'r7' and 'r2' in FIG. 3 is stored in 'r4' and 'r3' of FIG. 7.

The processing of block E proceeds in a similar manner as blocks B–D, except during cycle 5 and 6. There, an extra cycle is used to sum in the odd Decim. 1 output value, from register 'r10' of FIG. 3, that is stored in 'r2' of FIG. 7. By opening the switches 's3' and 's4' and closing 's2' of FIG. 7, the addition summation is performed in 'adder 3'.

The calculations necessary to perform Decim. 3 are now described. Since Decim. 3 is of the same form as Decim. 2, as discussed previously, the calculations needed to execute block A of FIG. 5 are the same as those needed to perform block A of FIG. 3.

The execution of the processing blocks A–D, where there are 26 processing blocks, not shown, between blocks C and D of FIG. 5 which are identical to each other and to block C, except for the coefficients, require the last even output of Decim. 2.

The processing of block E of FIG. 5 uses the last odd data of Decim. 2. The last 2 outputs of the Decim. 2 are stored in registers 'r6' and 'r7' of FIG. 7.

The processing of block A of Decim. 3 proceeds in a similar manner as the processing of block A of Decim. 2, except the even input data is located in register 'r6'. The output of Decim. 3, which is obtained when block A of FIG. 5 is calculated, is stored in 'r5' of FIG. 7 and then stored in 'r8'. The Decim. 3 output is then used from register 'r8' as an input to the compensator filter 22 (FIG. 1) which is also implemented by the architecture 120 of FIG. 7.

The processing of blocks B–D for Decim. 3 of FIG. 5 is in a similar manner as for blocks B–D of Decim. 2 of FIG. 3, described above.

The processing of block E of Decim. 3 of FIG. 5 is performed in a similar manner as block E of Decim. 2 of FIG. 3, except the odd input data for Decim. 3 is output from 'r7' of FIG. 7 instead of 'r2' as for block E of Decim. 2.

After completing the calculations for Decim. 3 and storing the output in 'r8' of FIG. 7, a second calculation for Decim. 2 is performed, as depicted in the FIG. 6 timing diagram. When block A of FIG. 3 is calculated and the output of Decim. 2 is stored in 'r5' of FIG. 7, the output is then stored in 'r6', and the value of 'r6' is stored in register 'r7'. Since there are 2 Decim. 2 outputs calculated between each Decim. 3 output calculation, 'r6' and 'r7' of FIG. 7 preferably always contain the last even and odd outputs of Decim. 2 for use in computing the Decim. 3 output. The last output of Decim. 3 is stored in 'r8' of FIG. 7.

This concludes the description of the calculations for Decim. 1, Decim. 2, Decim. 3 and compensator 22.

Figure 8:
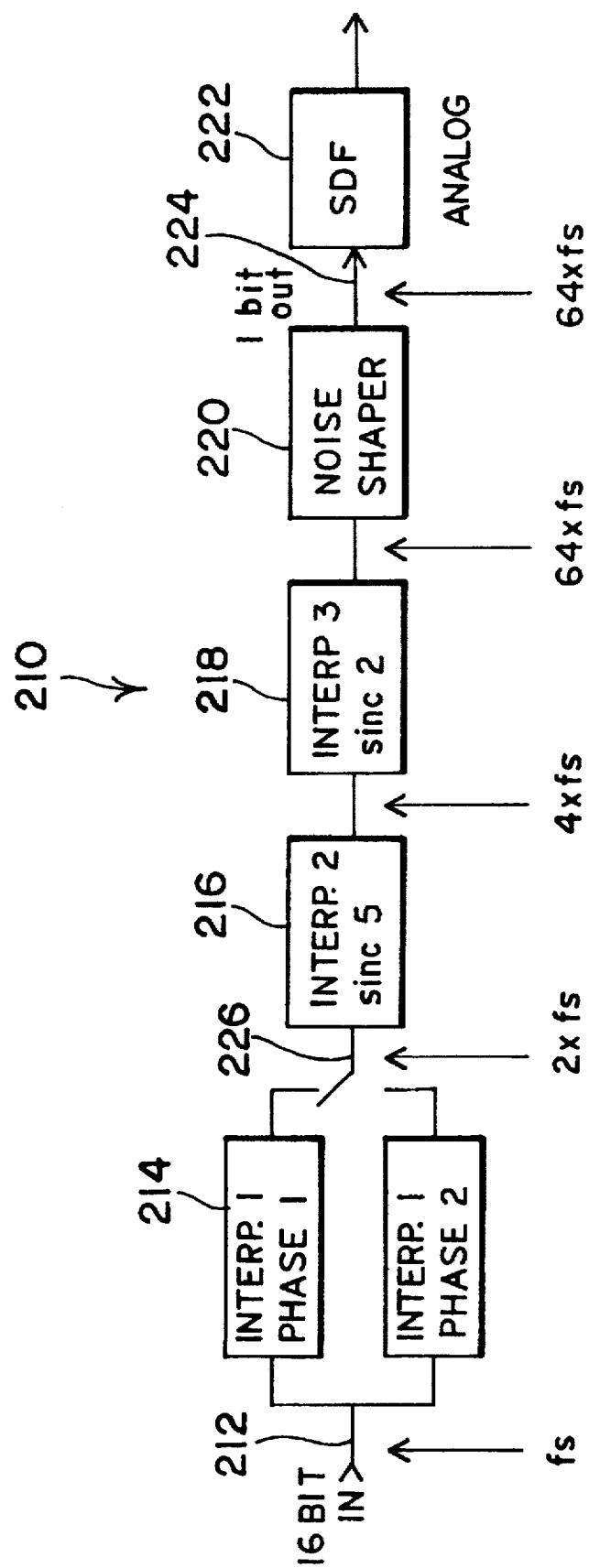
FIG. 8 is a block diagram of a D/A circuit utilizing the DSP interpolator architecture of the present invention.

The block diagram of a D/A circuit 10 utilizing the DSP architecture of the present invention is depicted in FIG. 8. The input data 212 is interpolated from the sample frequency, Fs, to 64 times the sample rate, 64 Fs, in three stages of interpolation (214, 216, 218). The multi-stage interpolation filter structure is more fully described in application Ser. No. 08/333,399, filed Nov. 2, 1994, entitled "Digital Interpolation Circuit for a Digital-to-Analog Converter Circuit", assigned to the common assignee of the present invention and incorporated herein for all purposes. The fourth stage, a 1-bit sigma-delta noise shaper circuit 220, more fully described in application Ser. No. 08/333, 386, entitled "Digital Noise Shaper Circuit," filed Nov. 2, 1994, assigned to the common assignee of the present invention and incorporated herein for all purposes, quantizes the data from a multiple bit signal to a one bit value using a fifth order system. Fourth order or other order systems may also be utilized. This quantization introduces noise which is 'shaped' via a high pass response filter function for the noise, due to quantization. This moves the noise energy to higher frequencies where it is filtered by the D/A fifth stage, 222, a semi-digital FIR filter (SDF), more fully described in application Ser. No. 08/526,834, filed Sep. 12, 1995, entitled "Combination D/A Converter and FIR Filter Utilizing Active Current Division and Method," assigned to the common assignee of the present invention and incorporated herein for all purposes. The first interpolation stage, 214, will be described herein in further detail.

The first interpolator stage, Interp. 1, 214 (phase 1 and phase 2 in combination as shown in FIG. 8), is an FIR filter with 79 taps whose data input 212 is at the sample rate of the input data Fs. In other embodiments, the number of taps may be greater or lesser. The 16 bit input 212 is linear two's complement data. Interpolator 1 has a filter response preferably having a passband extending to 0.45 Fs and a cutoff band beginning at 0.55 Fs. The stopband preferably has an attenuation of at least 100 dB. The architecture of the FIR filter is linear-phase with symmetrical coefficients. The coefficient multiplication of the filter taps is implemented using a summation of multiple shifts of the filter data. Interpolator 1 interpolates by a factor of 2, and thus the filter's input has every other data equal to zero. This allows a two phase implementation where each phase is approximately half the size of the entire Interp. 1 filter.

Audio systems typically use two common crystal oscillators frequencies to generate standard sample rates, typically 16.934 MHz and 24.576 MHz. The standard sample rate of 44.1 KHz can be generated from a 16.934 MHz clock. The standard sample rate of 48 KHz can be generated from a 24.576 MHz clock. The highest available clock rate is typically used to calculate an output from the interpolation filters using a minimal amount of hardware. A clock is generated from the crystal oscillators to obtain a frequency equal to 256 times the sample frequency selected. The architecture of all data path blocks in Interp. 1 use this clock signal of 256 times the sample frequency (Fs). The sample rate is preferably adjustable from 3.5 KHz to 48 KHz.

Figure 9:
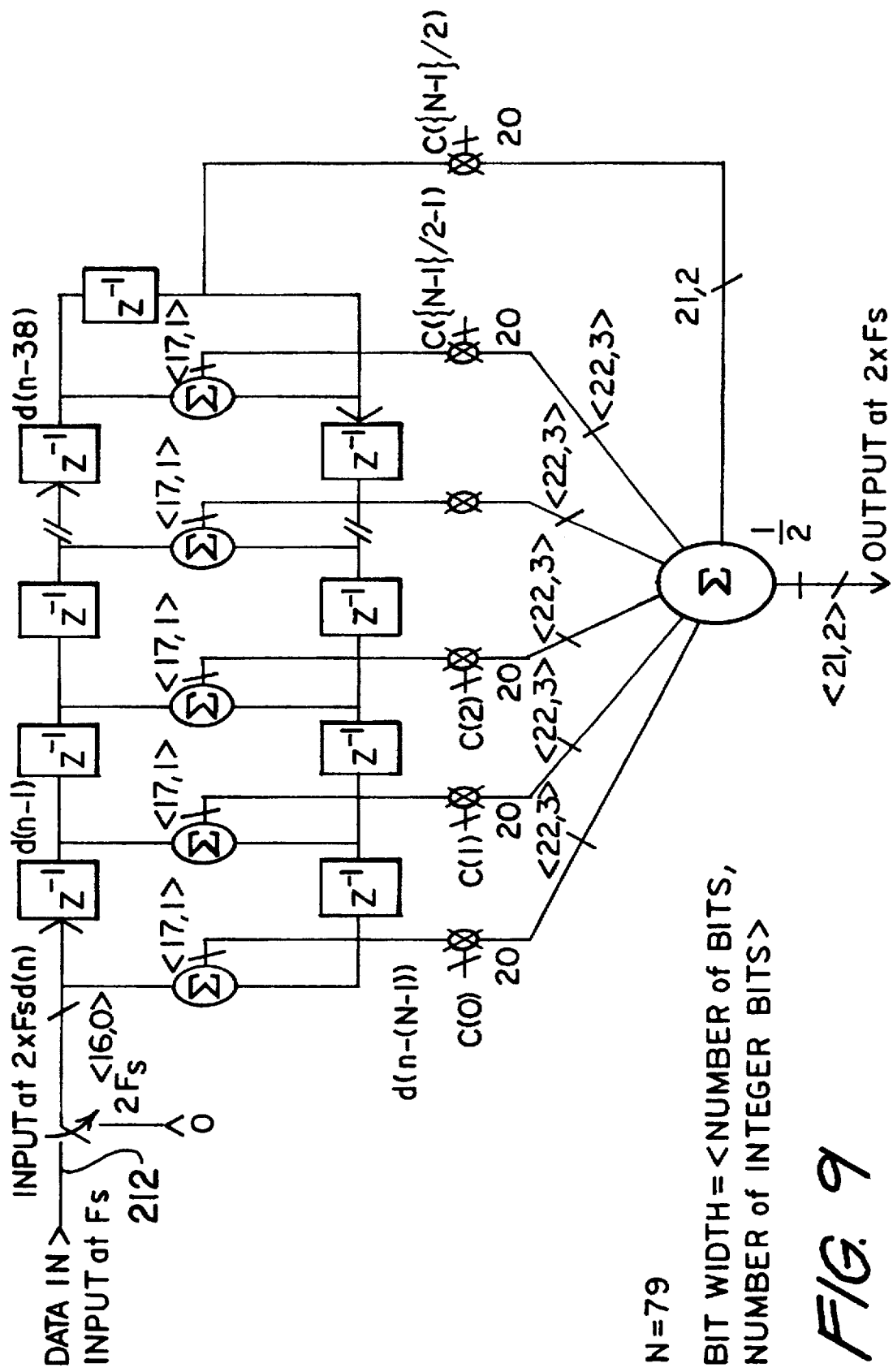
FIG. 9 is the architecture of a 79 tap FIR interpolation filter, which is linear-phase having symmetrical coefficients.

Shown in FIG. 9, the architecture of the 79 tap FIR filter, Interp. 1 of FIG. 8, is linear-phase with symmetrical coefficients. This symmetry allows a common folded architecture and is easily implemented by the DSP architecture of the present invention. Due to its 1:2 interpolation, the data path circuit for Interp. 1 needs only to calculate the odd coefficients for an output at 2 times the sample rate (2×Fs) and the even coefficients for the next output at 2×Fs. The equivalent processing rate amounts to calculating all 40 coefficients ($C_i$) (for a symmetrical filter with N=79) every sample period. This FIR is implemented in a block, shown in FIG. 10, where the same hardware is used to calculate both phases of the filter, one each sample period, Fs.

The architecture of FIG. 9 calculates each filter output at 2×Fs as shown in equations (18) and (19) below, where the output alternates between a $OUT_{odd}$ and $OUT_{even}$ output. The input data 212 has a dynamic range of 16 bits. The input data 212 is represented as 16 bits of fractional data, in two's complement form, which allows a full scale with respect to the input, which ranges from −1.0 to (1.0−$2^{-16}$). The magnitude of the data throughout the data path is considered with respect to this input dynamic range.

$$OUT_{even} = \Sigma C_i * [d_{n-i} + d_{n-(N-1)+i}] \text{ for } i=0,2,4 \ldots \text{ to } 38 \quad (18)$$

$$OUT_{odd} = \Sigma C_i * [d_{n-i} + d_{n-(N-1)+i}] + C_{39} + d_{39} \text{ for } i=1,3,5, \ldots \text{ to } 37 \quad (19)$$

where $d_n$ is the current input data and $d_{n-i} = Z^{-i} * d_n$ where N is the number of filter taps, 79

The architecture of Interp. 1, FIG. 9, is implemented with the circuit shown in FIG. 10. The coefficient multiplication of the data in the filter taps ($d_i$) is implemented using a summation of multiple shifts of the filter data. The coefficients for the FIR filter of Interp. 1 are listed in Table 1. In other filter embodiments, different coefficients may be used. The technique used to implement the coefficient values is described here prior to the explanation of FIG. 3. The coefficients have varying levels of resolution to achieve the sharp transition region, from passband to stopband, of 0.1*Fs. The coefficient values in Table 1 below are given with a resolution of 20 binary bits and an exponential term.

The coefficient's number, given in column 1 of Table 1, is the position of the coefficient in the filter as given by the index in equations (18) and (19). The order of execution of the coefficient multiplication, shown in Table 1, is from smallest coefficient value to largest coefficient value (smallest magnitude to the largest magnitude), for both the odd and even phase filter outputs.

This method preserves the accuracy of the smaller valued coefficients while using a constant word length. The coefficient value in Table 1, using a resolution of 20 binary bits, is stored, without the exponent in the coefficient memory ROM 50 of FIG. 10 using the Table 1 order of execution, along with a scaling factor. The scaling factor stored with each coefficient is not the exponential value of that coefficient, but is the difference between the exponential value of each coefficient and the succeeding one, using the Table 1 order of execution. This scaling factor is used to scale the accumulated products of data and coefficients to compensate for the differences in the exponential values of the 20 bit coefficients stored. Compensating the current accumulated products through multiplication of the scaling factor aligns the accumulated products with the current product of coefficient and data which makes multiplication more easily facilitated. Preferably, the scaling factors range from $2^{-0}$ to $2^{-3}$. The data path architecture allows the same circuitry in FIG. 10 to perform the coefficient multiplication and product scaling in an improved and efficient way. This allows the combination of coefficient values and scaling factors to be stored compactly in a ROM, or other memory device.

TABLE 1

| Coefficients for Interpolator 1 FIR | | | |
|---|---|---|---|
| coef. number | coefficient value | order of execution | scaling factor stored with coef. |
| 1 | $-.717044830322 \times 2^{-12}$ | odd phase-2 | $2^{-2}$ |
| 2 | $-.587711334229 \times 2^{-10}$ | even phase-1 | $2^{-0}$ |
| 3 | $-.527700424194 \times 2^{-10}$ | odd phase-4 | $2^{-0}$ |
| 4 | $.841259002686 \times 2^{-10}$ | even phase-2 | $2^{-0}$ |
| 5 | $.620119094849 \times 2^{-8}$ | odd phase-8 | $2^{-1}$ |
| 6 | $.888801574707 \times 2^{-9}$ | even phase-3 | $2^{-1}$ |
| 7 | $-.584827423096 \times 2^{-9}$ | odd phase-5 | $2^{-0}$ |
| 8 | $-.508468627930 \times 2^{-8}$ | even phase-4 | $2^{-0}$ |
| 9 | $.589366912842 \times 2^{-9}$ | odd phase-9 | $2^{-0}$ |
| 10 | $.791526794434 \times 2^{-8}$ | even phase-5 | $2^{-1}$ |
| 11 | $-.561088562012 \times 2^{-10}$ | odd phase-4 | $2^{-1}$ |
| 12 | $-.514154434204 \times 2^{-7}$ | even phase-6 | $2^{-0}$ |
| 13 | $-.938863754272 \times 2^{-14}$ | odd phase-1 | $2^{-2}$ |
| 14 | $.672943115234 \times 2^{-7}$ | even phase-7 | $2^{-0}$ |
| 15 | $.563703536987 \times 2^{-7}$ | odd phase-7 | $2^{-1}$ |
| 16 | $-.840948104858 \times 2^{-7}$ | even phase-8 | $2^{-0}$ |
| 17 | $-.651086807251 \times 2^{-8}$ | odd phase-9 | $2^{-1}$ |
| 18 | $.512119293213 \times 2^{-6}$ | even phase-10 | $2^{-0}$ |
| 19 | $.582284927368 \times 2^{-7}$ | odd phase-10 | $2^{-0}$ |
| 20 | $-.605270385742 \times 2^{-6}$ | even phase-11 | $2^{-0}$ |
| 21 | $.923715591431 \times 2^{-7}$ | odd phase-11 | $2^{-1}$ |
| 22 | $.696113586426 \times 2^{-6}$ | even phase-12 | $2^{-0}$ |
| 23 | $.685438156128 \times 2^{-6}$ | odd phase-12 | $2^{-0}$ |
| 24 | $-.777814865112 \times 2^{-6}$ | even phase-13 | $2^{-0}$ |
| 25 | $-.975055694580 \times 2^{-6}$ | odd phase-13 | $2^{-1}$ |
| 26 | $.841688156128 \times 2^{-6}$ | even phase-14 | $2^{-0}$ |
| 27 | $.675539106724 \times 2^{-6}$ | odd phase-14 | $2^{-0}$ |
| 28 | $-.873836517334 \times 2^{-6}$ | even phase-15 | $2^{-0}$ |
| 29 | $.923152923584 \times 2^{-5}$ | odd phase-15 | $2^{-1}$ |
| 30 | $.849981307983 \times 2^{-6}$ | even phase-16 | $2^{-0}$ |
| 31 | $.629726409912 \times 2^{-4}$ | odd phase-16 | $2^{-0}$ |
| 32 | $-.720279693604 \times 2^{-6}$ | even phase-17 | $2^{-0}$ |
| 33 | $-.870679855347 \times 2^{-4}$ | odd phase-17 | $2^{-1}$ |
| 34 | $.720285415649 \times 2^{-7}$ | even phase-9 | $2^{-1}$ |
| 35 | $.623207092285 \times 2^{-3}$ | odd phase-18 | $2^{-0}$ |
| 36 | $.625934600830 \times 2^{-6}$ | even phase-18 | $2^{-2}$ |

TABLE 1-continued

| Coefficients for Interpolator 1 FIR | | | |
|---|---|---|---|
| coef. number | coefficient value | order of execution | scaling factor stored with coef. |
| 37 | $.953193664551 \times 2^{-3}$ | odd phase-19 | $2^{-1}$ |
| 38 | $-.996269226074 \times 2^{-4}$ | even phase-19 | $2^{-3}$ |
| 39 | $.782382965088 \times 2^{-2}$ | odd phase-20 | $2^{-2}$ |
| 40 | $.697450637817 \times 2^{-1}$ | even phase-20 | $2^{-1}$ |

For an efficient calculation of the product of a coefficient and data, the coefficients are stored in a ROM using a coded canonical format. Using canonical representation of the coefficients reduces the number of non-zero bits in memory. This reduces the number of summations needed to form the product of the coefficient and data. The definition of these bits are given in equations (21) and (22), below.

Each coefficient's 20 binary bit mantissa (C') of Table 1 is represented in canonical notation as:

$$c' = \Sigma b_j 2^{-j} \quad (20)$$

where $b_j \in (-1,0,1)$, $j=0-19$ with $j=0$ being the MSB

This results in a coefficient having a minimum number of non-zero bits in accordance with the well known canonical notation. Each 20 binary bit mantissa C', is stored in memory and is coded as follows, with $C_j''$ representing each coded bit in the stored coefficient, as follows:

$$C_j''=1 \text{ for } b_j=1, \text{ where} \quad (21)$$

$$C_{j-1}''=C_j''=1 \text{ for } b_j=-1, \text{ where } j=0-19, \quad (22)$$

since $b_j * b_{j-1}=0$ for canonical representation. Thus, the zero to the left of a canonical '$-1$' bit is changed to a '1', and the '$-1$' is changed to a '1', resulting in a binary representation (0,1).

The coefficients cannot be stored directly in a ROM in canonical form since each bit can take on one of three values. Thus, coefficients are stored as the coded $C_j''$ bits, directly. For 20 bits of resolution in the coefficients, 21 bits need to be stored to allow the MSB to be coded when equal to '$-1$'. This results in simple decoding of the coefficient values without separating negative and positive canonical bits and having to store them separately. Using this coded canonical format maintains a minimum number of non-zero bits when the coefficient is decoded. Since canonical representation has, at most, one half the digits having non-zero values, this representation requires the maximum number of additions to be one half the number of bits used to represent the coefficient.

Since a shift and add scheme is used to calculate the products of the coefficient and the data, as given above in equations (18) and (19), the same shifting circuitry is used to scale the product by storing additional bits along with the 20 binary bits as coded, using equations (21) and (22). In the preferred implementation, 3 scaling bits are stored, which are decoded and used to compensate for the coefficient scaling factor from Table 1. This approach requires 40 coef.*(21 bits/coef.+3 bits for partial product shifts)=960 bits to be stored in the coefficient memory ROM of FIG. 10.

To calculate an output from the Interp. 1 filter when the sample rate can be up to 48 KHz in audio systems using a crystal oscillator which commonly operates at 16.934 MHz or 24.576 MHz, a scheme is needed to perform the 40 multiply/accumulate operations, along with the shifting operations needed, to compensate for the scaled coefficients in one sample period. To use an architecture without a multiplier, typically a bit serial method is used to perform the multiplication task. This involves reading each bit of the coefficient from the least significant bit (LSB) to most significant bit (MSB). For each bit of the coefficient that is a '1', the data is added in an accumulator. The value in the accumulator is then shifted by one, equivalent to a multiplication by $2^{-1}$, prior to the next data value being added. This bit serial implementation does not have the throughput needed using the frequencies mentioned above for audio rates.

The method used herein operates on 4 bits of a coefficient at a time, LSB to MSB. Since the coefficients are coded as mentioned above, to operate on 4 bits, $C''_j$–$C''_{j-3}$, the LSB of the next 4 bits, $C''_{j-4}$, is needed to decode the sign of the $C''_{j-3}$ bit. See equations 21 and (22). To decode the bit $C''_j$, of the stored coefficient, $C''$, the sign and magnitude of the MSB from the previous 4 bits is needed. Register 6 of FIG. 10 facilities this since it holds the coded bit, $C''_{j+1}$, 1 LSB away from the current 4 bits being decoded. The decoded sign of the bit in register 6 is stored in 'C" 4 bit decode block 52. These seven bits: $C''_{j+1}$, the sign of $C''_{j+1}$, and $C''_j$–$C''_{j-4}$, are made available to decode the $C''_j$–$C''_{j-3}$ bits by always reading ahead 4 bits. The coefficient bits are read out of the 'coef memory ROM' 50 4 bits at a time into register 4 where j=19, 15, 11, 7, and 3.

Below are the logic equations (23)–(29) used to calculate the amount of shift needed to calculate the current data. The amount of shift is determined from the decoding of the current 4 stored coded coefficient bits and is used to control 'shifter 1' and 'shifter 2' of FIG. 10 with 'shift1_sel[2:0]': The four coefficient bits determine five possibilities for 'shifter_1' and 'shifter_2' of FIG. 10. Possible values for shifting the data using 'shifter_1' and 'shifter_2', are $2^0$, $2^{-1}$, $2^{-2}$, $2^{-3}$ and outputing zero. The shifts of $2^0$ and $2^{-1}$ are implemented in shifter 1 of FIG. 10. The shifts of $2^{-2}$ and $2^{-3}$ are implemented in shifter 2 of FIG. 10. If one of the shifters is not needed, it outputs zero. Both shifters may output zero if all the coefficient bits being decoded are zero. Since the decoded coefficient bits may take on the values of (−1, 0, or 1), the two's complement signals TC1 and TC2 are decoded, as per equations (28) and (29), respectively, to determine whether the data sum is inverted.

The new value of the sign of $C''_{j+1}$ is determined as follows:

r6_sign = r4[0] & r5[5] & ¬r5[2]‖ (23)
r4[0] &r5[3] &r5[2] &r5[1] &¬r5[0]‖
r4[0] &r5[3] &r5[2] &r5[1] &r5[0] & r6 & r6_sign The possible shifts are decoded as follows:

shift_0 = (r5[3] & ¬r5[2])‖ (24)
(r5[3] & r5[2] & r5[1] & ¬r5[0])‖
(r5[3] & r5[2] & r5[1] & r5[0] & r6 & r6_sign)
shift_1 = (r5[2] & ¬r5[1])‖ (25)
(r5[2] & r5[1] & r5[0] & ¬r6)‖
(r5[2] & r5[1] & r5[0] & r6 & ¬r6_sign)
shift_2 = (r5[1] & ¬r5[2])‖ (26)
(r5[1] & r5[0] & r6 & r6_sign)
shift_3 = (r5[0] & r6 & ¬r6_sign)‖ (27)
(r5[0] & ¬r6)
TC1 = (r4[0] & r5[3] ‖ & (r5[3] & r5[2] & shift_1) (28)
TC2 = (r5[2] & r5[1] ‖ & (r5[1] & r5[0] & shift_3) (29)

where shift_x causes a bit shift equivalent to 2* in shifter 1 and shifter 2, and where:

the symbol ¬ is the a logical inversion,
the symbol '‖' is the logical OR function, and
the symbol '&' is the logical AND function.

The following describes the calculation of the output of Interp. 1 using the architecture depicted in FIG. 10. The output 26 of Interp. 1 (FIG. 8) is calculated by outputing a result using the even phased coefficients of Table 1 followed by outputing a result using the odd phased coefficients of Table 1, as given in equations (18) and (19). The first values read out of the 'coef memory ROM' 50 of FIG. 10 are the 4 LSBs of coefficient C"2, $C''2_{16-19}$, since C"2 is the first coefficient executed according to the order of execution identified in Table 1, where the number '2' is the coefficient number from Table 1.

The data to be multiplied by C"2 are stored in the 'sample RAM' 54 of FIG. 10. The 'RAM control' block, uses data from the 'coef order ROM' 58. This ROM 58 stores the order of coefficient execution, as given in Table 1, and is read once per coefficient. The execution order is used to calculate the address of the 'sample RAM' 54 to read the 2 data values to be summed for multiplication by a coefficient as given in equations (18) and (19). The 'sample RAM' 54 is read for the first data value, $d_{n-2}$, which is stored in register 1.

On the next clock cycle, the second data value, $d_{n-(79-1)+2}$, is read from 'sample RAM' 54 and stored in register 2. When the second data is read from the 'sample RAM 54, the first four LSBs of the coefficient are stored in register 4, $C''2_{16-19}$.

During the next clock cycle, the two data values previously read and stored in reg 1 and reg 2 are added in 'adder 3' to form the data sum to be multiplied by the coefficient. The data sum is then stored in register 3. The coefficient 4 bits stored in register 4 are transferred into register 5 while the next coefficient 4 bits, $C''2_{12-15}$, are latched in register 4. The MSB of the 4 bits in register 5 is transferred into register 6, which would initially be 0 from reset. Internal to the 'C" 4 bit Decode block' 52 of FIG. 10, the sign of the MSB in reg 5 is stored from the previous decode, as r6_sign. Initially, this value would also be 0 from reset. With the previous MSB bit decoded as a +1 or −1, the decode of the next 4 bits is accomplished with a simple decode circuit (not shown), as per equations (23)–(29). As explained above, a total of seven bits of information are used to decoded the 4 C" bits to be multiplied by the data sum, to form a partial product as follows:

$$PP_j = (C''_j{}_{-3}) * (data) \quad (30)$$

where j=bit positions (19, 15, 11, 7 and 3); where j=0 is the MSB and j=19 is the LSB. The product of the 20 bit coefficient multiplied by the 17 bit data sum from reg. 3 is calculated in the following manner:

$P = ((((((PP_{19} \times 2^{-4}) + PP_{15}) \times 2^{-4}) + PP_{11}) \times 2^{-4}) + PP_7) \times 2^{-4}) + PP_3$, or equivalently, $$P = \sum_{j=19, j-4}^{3} PP_{j-4} * 2^{-4} + PP_j \quad (31)$$

for j = 19,15,11,7,3

In summary, the 4 bits coefficient in register 5, $C''_j$–$C''_{j-3}$, the MSB bit in register 6, $C''_{j+1}$, the sign of $C''_{j+1}$ stored in the 'C" 4 bit decode' block 52 of FIG. 10, and the MSB bit in register 4, which represents the $C''_{j-4}$ bit, are made available to the 'C" 4 bit decode' block 52 of FIG. 10.

The coded canonical coefficients stored in coefficient memory ROM 50 (FIG. 10), when decoded, result in at most two non-zero bits in any field of 4 coefficient bits in each coefficient C". This results in at most two shifted data values that need to be added together to form the partial product shown in equation (30). This scheme uses adders 1 and 2 of FIG. 10 to evaluate 4 coefficient bits per clock cycle. This results in using half as many adders as the number of coefficient bits read in one cycle when reading an even number of bits each cycle, which is preferred.

The "C" 4 bit decode' block 52 outputs 1 bit, TC1, to the '1's comp 1' block 62 and the carry in (ci) of 'adder 1' when the sign of the decoded bit of $C'_j$ or $C'_{j-1}$ from equation (20) is negative. Three additional bits are output from the 'C" 4 bit decode' 'block 52 to the 'shifter 1' block which determine if shifter 1 will output zeroes (blank), or perform no shifting ($2^{-0}$) on the output of 'mux 1', or shift the data by bit value 1 ($2^{-1}$). Three different bits are output from the 'C" 4 bit decode' block 52 to the 'shifter 2' block 66 which determine if shifter 2 will output zeroes (blank), or perform no shifting ($2^{-0}$) on the output of 'mux 1', or shift the data by 1 bit value ($2^{-1}$). Decoded bits $C'_{j-2}$ and $C'_{j-3}$ determine the sign and the shift through the '1's comp 2' 60 and 'shifter 2' 66 blocks. The fixed shift $2^{-2}$ into the '1's comp 2' block 60 allows 'shifter 2' 66 to implement shifts of $2^{-2}$ and $2^{-3}$. During the coefficient multiplication, mux1_sel=1 to select the data in register 3. The output of 'shifter 1', is added to the output of 'shifter 3' in adder 1.

The partial product accumulator register 'ppacc' is reset on the beginning of the new coefficients multiplication. When the 4 LSBs of each coefficient $C''_j$–$C''_{j-3}$ are decoded, register 'ppacc' is equal to zero and the output of 'shifter 3' is equal to zero. The output of adder 1 is added to the output of 'shifter 2' in 'adder 2'.

Initially, the first 4 coefficient bits read from the coefficient memory ROM 50 are the LSBs from coefficient number 2, $C''2_{16-19}$, as given by the order of execution for the even phase in Table 1. These 4 bits are stored in register r4. The partial product of the coefficient and data sum of equation (30), from adder 2, is stored in register 'ppacc'. Since a new product is now being calculated, the 'ppacc' register is cleared by a control block, not shown, via the 'ppacc' clear signal.

On the next clock cycle, these 4 coefficient bits are latched into register r5 and the next 4 coefficient bits, $C''2_{12-15}$, are read out of the 'coeff. memory ROM' 50 and stored in register r4. The 4 coefficient bits in register r5 are then decoded and used to control shifting and inverting of the data in register r3, as per equations (23)–(27), as previously explained.

This partial product, $PP2_{16}=(C''2_{16-19})^* (d_{n-2}+d_{n-(79-1)+2})$ is stored in register 'ppacc' on the next clock cycle. The MSB of register 5 is stored in register 6, the 4 bits in register 4 are stored in register 5, and the next 4 coefficient bits $C''2$, $C''2_{8-11}$, are read into register 4. The second 4 LSBs, $C''2_{12-15}$, are decoded to control 'shifter 1' and 'shifter 2' and used to shift the data in register 3 according to the decoded bits. The 'shifter 3' block is controlled by the 'sh3_sel' signal to shift the output of 'ppacc' by $2^{-4}$. This scales the current partial product stored in 'ppacc' to the partial product currently being calculated, as shown in equation (31), above.

On the next clock cycle, the sum of 'shifter 1', 'shifter 2' and 'shifter 3' is stored in 'ppacc' as the new accumulated partial product, $PP2_{12}=(C''2_{12-16})^* (d_{n-2+dn-(79-1)+2})+PP2_{16} * 2^{-4}$. The MSB of register 5 is stored in register 6, the 4 coefficient bits in register 4 are stored in register 5, and the next 4 coefficient bits of $C''2$, $C''2_{4-7}$, are read into register 4. The decode of $C''2_{8-11}$, now in register 5, controls 'shifter 1' and 'shifter 2' which shifts the data sum previously output from register 3. The 'shifter 3' block is controlled by the 'sh3_sel' signal to shift the output of 'ppacc' by $2^{-4}$.

On the next clock cycle, the sum of 'shifter 1', 'shifter 2', and 'shifter 3' is stored in 'ppacc' as the new accumulated partial product. $PP2_8=(C''2_{8-11})^* (d_{n-2}+d_{n-(79-1)+2})+ PP2_{12}*2^{-4}$. The MSB of register 5 is stored in register 6, the 4 coefficient bits in register 4 are stored in register 5, and the next 4 coefficient bits $C''2$, $C''2_{0-3}$, are read into register 4. The decode of $C''2_{4-7}$, now in register 5, controls 'shifter 1' and 'shifter 2' which shifts the data sum previously output from register 3. The 'shifter 3' block is controlled by the 'sh3_sel' signal to shift the output of 'ppacc' by $2^{-4}$.

On the next clock cycle, the sum of 'shifter 1', 'shifter 2', and shifter 3' is stored in 'ppacc' as the new accumulated partial product, $PP2_4=(C''2_{4-7})^*(d_{n-2}+d_{n-(79-1)+2})+PP2_8 * 2^{-4}$. Since the last of the 20 bits of the coefficient has been read out of the 'coef memory ROM' 50, the next 4 coefficient bits read from the coefficient memory ROM 50 are: the MSB of the coded coefficient, and the scaling factor (3 bits) as identified in Table 1.

The second coefficient multiplication to be executed for the even phase output of the filter is coefficient C4, as given by Table 1. The exponent of C2 and C4 are the same, and therefore the scaling factor associated with C2 is zero. In general, the 3 bit scaling factor is read into register 4. The decode of $C''2_{0-3}$, now in register 5, controls 'shifter 1' and 'shifter 2' which shift the data sum previously output from register 3. The 'shifter 3' block is controlled by the 'sh3_sel' signal to shift the data sum previously output from 'ppacc' by $2^{-4}$. The first data, $d_{n-4}$, needed for multiplication by the coefficient for the even phase filter output, C4, is read from the 'sample RAM' 54 and stored in register 1.

On the next clock cycle, the sum of 'shifter 1', 'shifter 2', and 'shifter 3' is stored in 'pacc' as the final product, $PP2_0=(C''2_{0-3})^* (d_{n-2}+d_{n-(79-1)+2})+PP2_4 * 2^{-4}=P2=(C-2'')^* (d_{n-2}+d_{n-(79-1)+2})$. The 3 bits of scaling stored with coefficient C"2 are loaded into register 5. The 4 LSBs of the next coefficient, $C''4_{16-19}$, are read into register 4 in preparation for multiplication by the appropriate data, as given by equation (18). The second data value, $d_{n-(79-1)+4}$, is read from the 'sample RAM' 54 and loaded into register 2. The 'C" 4 bit decode' block 52 clears register 6 and the stored sign of register 6 for the decoding of the scaling value, so the previous coefficient data does not effect the decode of the 3 scaling bits. This allows the same decode circuit to be used to decode the coefficient bits and the coefficient scaling bits.

The product accumulator register 'pacc' is used to store the accumulated value of the partial products of coefficients and data from equations (18) and (19) and initially contains 0. During this clock cycle, mux1_sel=0 to allow 'shifter 1' and 'shifter 2' to shift the resultant sum of products stored in 'pacc' to compensate for the differences in the exponential values for the coefficients in Table 1. This is the scaling factor. After each final product of coefficient and data is obtained, the amount of scaling applied to the product accumulator register 'pacc' is between $2^0$ and $2^{-3}$. This defines the maximum difference in the scaling between two coefficients. The data output from 'pacc' is scaled by 'shifter 1' and 'shifter 2'. The control signal sh3_sel=0 causes 'shifter 3' to not shift the 'pacc' value. The output of 'adder 2' is the sum of the value in 'pacc' and the current product, P2.

On the next clock cycle, the new accumulated value, initially the product P2, is stored in 'pacc'. These six clock cycles conclude the calculation of the first product.

The next 4 LSBs of the coefficient, $C''4_{12-16}$, are read into register 4 while the contents of register 4 are loaded into register 5. The partial product accumulator register 'ppacc' is cleared and mux1_sel=1 to select the data sum in register 3 for multiplication by coefficient C4. The LSBs now in register 5 are decoded and used to shift register 3. This allows the product of each 20 bit coefficient multiplied by the sum of the filter tap data, as defined in equations (18) and (19), to be evaluated in 5 clock cycles, plus 1 cycle for accumulation of products and shifting the product to compensate for the increasing magnitude in the coefficients, C, reflected in the magnitude of the exponential values of the coefficients in Table 1. This method makes the best use of the available bit width to maintain the accuracy of the coefficients on the final output of Interp. 1 by truncating after each summation of products having the same magnitude.

In summary, the entire Interp. 1 filter 214 (FIG. 8) is implemented in this manner by taking the current result of the accumulated products of coefficient and data that is stored in the product accumulator, 'pacc' of FIG. 10 and shifting it according to the scaling factor for each coefficient and adding the current product. When all the products of the coefficients and data as given in equation (18) are complete, the output of the Interp. 1 filter is available for further interpolation, for input to a sigma-delta modulator, or is otherwise available for any purpose. During the calculation of the Interp. 1 output from the odd phase coefficients, as given in equation (19), the RAM control block 56 (FIG. 10) is used to read data from the sample RAM 54 such that during one such calculation, only one data value is read, since this value is the center tap of the Interp. 1 filter which is multiplied by coefficient $C_{39}$.

Regarding the sample RAM block 54 addressing, the input data 212 is written into the sample RAM 54 at the sample rate FS. A write pointer is used by the RAM control block 56 to keep track of the current next available address, writing over old data at the proper time. A read pointer is used by the RAM control block 56 to calculate the addresses of the Interp. 1 filter tap data, $d_i$, and $d_{n-(N-1)-i}$, from equations (18) and (19). The read pointer monitors the write pointer and the current coefficient to be multiplied by the filter taps. As in Table 1, the order of calculating the products of coefficients and data is based on the magnitude of the coefficient. This order of execution, from Table 1, is stored in the coefficient order ROM 58 of FIG. 10 and is used by the sample RAM read pointer to read the proper data values from sample RAM 54. The coefficient order ROM 58 is read directly into the RAM control block 56 of FIG. 10. Since the coefficient multiplication takes 6 cycles, as described above, every 6 cycles two new data values are read out of the sample RAM 54 and loaded into registers 1 & 2, except for multiplication of coefficient $C_{39}$ during the calculation of the odd phase Interp. 1 output, described above and shown in equation (19). The two data values read from the sample RAM 54 are added together in adder 3 then stored in register 3. This performs the addition of the data values in equations (18) and (19) that resulted from the symmetrical coefficient values of Table 1. Register 3 is input into the '1's comp. 1' and '1's comp. 2' blocks for each of the 5 sets of 4 coefficients bits decoded from each 20 bit interpolation filter coefficient.

The present invention, therefore, is well adapted to carry out the objects and attain the ends and advantages mentioned herein as well as other ends and advantages made apparent from the disclosure. While preferred embodiments of the invention have been described for the purpose of disclosure, numerous changes and modifications to those embodiments described herein will be readily apparent to those skilled in the art and are encompassed within the spirit of the invention and the scope of the following claims.

What is claimed is:

1. A method of operating a digital FIR filter, comprising the steps of:
   (a) providing a multi-bit input signal;
   (b) providing a plurality of digital filter coefficients, each said coefficient comprised of a plurality of bits, n;
   (c) providing a coefficient scaling factor for each said filter coefficient;
   (d) obtaining a partial product by multiplying a plurality of bits, f, of a selected one of said filter coefficients by said input signal, where f<n;
   (e) obtaining an other partial product by multiplying another plurality of bits, s, of said selected one of said filter coefficients by said input signal, where s<n;
   (f) obtaining an accumulated partial product by scaling said other partial product by a selected partial product scaling factor and then adding said scaled other partial product to said partial product;
   (g) obtaining a product by repeating steps (e)–(f) and adding each successive calculated accumulated partial product to the prior accumulated partial product until all bits of each said selected filter coefficient have been processed;
   (h) obtaining an other product by repeating steps (d)–(g) for another one of said digital filter coefficients;
   (i) obtaining an accumulated product by scaling said product by a selected coefficient scaling factor and then adding said scaled product to said other product;
   (j) obtaining a filter output final product by repeating steps (h)–(i) and adding each successive calculated product to the prior accumulated product until each of said filter coefficients has been entirely processed; and
   (k) outputting a multi-bit output signal, where said output signal represents the value of said filter output final product.

2. The method of claim 1, wherein said FIR filter being operated upon is transposed.

3. The method of claim 1, wherein said FIR filter being operated upon comprises a plurality of cascaded FIR filters.

4. The method of claim 1, wherein the number of bits comprising said plurality of bits, f and s, for any selected filter coefficient is a multiple of two.

5. A digital FIR filter, comprising:
   (a) a multi-bit input signal;
   (b) a coefficient memory device having a plurality of digital filter coefficients stored therein, wherein each said coefficient comprises a plurality of bits, x;
   (c) a coefficient decode circuit having an output, wherein at least a portion of each plurality of bits, n, of each said filter coefficient is provided to said decode circuit, where n<x;
   (d) a multiplication block, wherein said decode circuit output is input to and controls the operation of said multiplication block;
   wherein said multiplication block multiplies each of said filter coefficients by said input signal such that only n bits of each said filter coefficient is multiplied by said input signal during any multiplication operation; and
   wherein a signal is output from said multiplication block after all of said bits of each said filter coefficient has been multiplied by said input signal.

6. The filter of claim 5, wherein during any multiplication n/2 adders are used by said multiplication block.

7. The filter of claim 5, wherein said filter coefficients are coded.

8. The filter of claim 5, wherein said multiplication block includes:
   (a) a two's compliment block;
   (b) at least one shifter circuit connected to said two's compliment block; and
   (c) at least one adder connected to said at least one shifter circuit.

9. The filter of claim 8, wherein said two's compliment block comprises a one's compliment circuit and an adder.

10. The filter of claim 5, further comprising an accumulated product storage register.

11. The filter of claim 5, wherein said input signal is stored in an input signal memory device;

wherein a first selected value of said input signal is stored in a first location in said input signal memory device and is provided to a first register; and wherein a second selected value of said input signal is stored in a second location in said input signal memory device and is provided to a second register.

* * * * *